(12) United States Patent
Bao et al.

(10) Patent No.: US 10,672,905 B2
(45) Date of Patent: Jun. 2, 2020

(54) REPLACEMENT METAL GATE PROCESS FOR VERTICAL TRANSPORT FIELD-EFFECT TRANSISTOR WITH SELF-ALIGNED SHARED CONTACTS

(71) Applicant: International Business Machines Corporation, Armonk, NY (US)

(72) Inventors: Ruqiang Bao, Niskayuna, NY (US); Brent A. Anderson, Jericho, VT (US); ChoongHyun Lee, Rensselaer, NY (US); Hemanth Jagannathan, Niskayuna, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 16/106,379

(22) Filed: Aug. 21, 2018

(65) Prior Publication Data
US 2020/0066903 A1    Feb. 27, 2020

(51) Int. Cl.
*H01L 29/78* (2006.01)
*H01L 29/423* (2006.01)
(Continued)

(52) U.S. Cl.
CPC .. *H01L 29/7827* (2013.01); *H01L 21/823885* (2013.01); *H01L 27/092* (2013.01); *H01L 29/42376* (2013.01); *H01L 29/66545* (2013.01)

(58) Field of Classification Search
CPC .......... H01L 29/7827; H01L 29/42376; H01L 29/66545; H01L 27/092; H01L 21/823885
See application file for complete search history.

(56) References Cited

U.S. PATENT DOCUMENTS 6,770,534 B2   8/2004   Cho et al.
6,773,994 B2   8/2004   Chittipeddi et al.
(Continued)

FOREIGN PATENT DOCUMENTS

CN          103972067 A        1/2014
CN          105261645 A        7/2014
WO  PCT/IB2018/060735         5/2019

OTHER PUBLICATIONS

S. Yamaguchi et al., "Effective Work-Function Control Technique Applicable to p-Type FinFET High-k/Metal Gate Microelectronics Devices," Microelectronics Reliability. May 2017, pp. 80-84, vol. 72.

(Continued)

*Primary Examiner* — Mark W Tornow
(74) *Attorney, Agent, or Firm* — Vazken Alexanian; Ryan, Mason & Lewis, LLP

(57) ABSTRACT

A semiconductor structure includes a substrate, a bottom source/drain region disposed on a top surface of the substrate, and a plurality of fins disposed over a top surface of the bottom source/drain region. The fins provide vertical transport channels for one or more vertical transport field-effect transistors. The semiconductor structure also includes at least one self-aligned shared contact disposed between an adjacent pair of the plurality of fins. The adjacent pair of the plurality of fins includes a first fin providing a first vertical transport channel for a first vertical transport field-effect transistor and a second fin providing a second vertical transport channel for a second vertical transport field-effect transistor.

20 Claims, 25 Drawing Sheets

(51) Int. Cl.
   *H01L 21/8238* (2006.01)
   *H01L 29/66* (2006.01)
   *H01L 27/092* (2006.01)

(56) References Cited

U.S. PATENT DOCUMENTS

| | | | |
|---|---|---|---|
| 7,683,428 B2* | 3/2010 | Chidambarrao | H01L 29/66787 257/302 |
| 8,274,110 B2* | 9/2012 | Sandhu | H01L 27/2463 257/329 |
| 8,455,932 B2 | 6/2013 | Khakifirooz et al. | |
| 8,865,581 B2 | 10/2014 | Clark | |
| 8,877,575 B2 | 11/2014 | Fumitake | |
| 9,048,254 B2 | 6/2015 | Chen et al. | |
| 9,087,897 B1* | 7/2015 | Anderson | H01L 29/7827 |
| 9,136,178 B2 | 9/2015 | Li et al. | |
| 9,209,278 B2 | 12/2015 | Tang et al. | |
| 9,437,503 B1 | 9/2016 | Mallela et al. | |
| 9,502,566 B2 | 11/2016 | Fenouillet-Beranger et al. | |
| 9,530,863 B1 | 12/2016 | Zhang et al. | |
| 9,530,866 B1* | 12/2016 | Zhang | H01L 29/66666 |
| 9,536,793 B1 | 1/2017 | Zhang et al. | |
| 9,613,868 B2 | 4/2017 | Yu | |
| 9,640,636 B1 | 5/2017 | Bentley et al. | |
| 9,653,465 B1 | 5/2017 | Balakrishnan et al. | |
| 9,773,708 B1 | 9/2017 | Zhang et al. | |
| 9,780,208 B1 | 10/2017 | Xie et al. | |
| 9,786,788 B1* | 10/2017 | Anderson | H01L 29/78642 |
| 9,799,751 B1 | 10/2017 | Zhang et al. | |
| 9,859,421 B1 | 1/2018 | Robison et al. | |
| 9,882,047 B2 | 1/2018 | Leobandung | |
| 9,911,738 B1 | 3/2018 | Niimi et al. | |
| 9,935,199 B2 | 4/2018 | Ching et al. | |
| 10,014,370 B1 | 7/2018 | Xie et al. | |
| 2006/0166429 A1 | 7/2006 | Chaudhry et al. | |
| 2006/0261406 A1 | 11/2006 | Chen | |
| 2016/0240626 A1* | 8/2016 | Chang | H01L 29/42392 |
| 2017/0025412 A1* | 1/2017 | Jun | H01L 21/82348 |
| 2017/0053913 A1 | 2/2017 | Min et al. | |
| 2017/0162446 A1 | 6/2017 | Balakrishnan et al. | |
| 2017/0179282 A1 | 6/2017 | Balakrishnan et al. | |
| 2017/0194155 A1* | 7/2017 | Anderson | H01L 21/28518 |
| 2017/0288056 A1 | 10/2017 | Balakrishnan et al. | |
| 2018/0006118 A1 | 1/2018 | Mallela et al. | |
| 2018/0019337 A1 | 1/2018 | Xie et al. | |
| 2018/0053847 A1 | 2/2018 | Balakrishnan et al. | |
| 2019/0172830 A1* | 6/2019 | Ok | H01L 27/0924 |

OTHER PUBLICATIONS

A.P. Jacob et al., "Scaling Challenges for Advanced CMOS Devices," International Journal of High Speed Electronics and Systems, 2017, 76 pages, vol. 26, No. 1.

Disclosed Anonymously, "Method and Structure of Forming VFET Bottom Spacer and Replacement Gate," ip.com, ip.com No. IPCOM000250753D, Aug. 30, 2017, 9 pages.

List of IBM Patents or Patent Applications Treated as Related.

* cited by examiner

100

200

300

400

500

800

900

1000

1100

1300

1400

1500

1600

1700

1800

1900

2000

2100

2300

2400

2500

REPLACEMENT METAL GATE PROCESS FOR VERTICAL TRANSPORT FIELD-EFFECT TRANSISTOR WITH SELF-ALIGNED SHARED CONTACTS

BACKGROUND

The present application relates to semiconductors, and more specifically, to techniques for forming semiconductor structures. Semiconductors and integrated circuit chips have become ubiquitous within many products, particularly as they continue to decrease in cost and size. There is a continued desire to reduce the size of structural features and/or to provide a greater amount of structural features for a given chip size. Miniaturization, in general, allows for increased performance at lower power levels and lower cost. Present technology is at or approaching atomic level scaling of certain micro-devices such as logic gates, field-effect transistors (FETs), and capacitors.

SUMMARY

Embodiments of the invention provide techniques for replacement metal gate processes for forming vertical transport field-effect transistors having self-aligned shared contacts.

In one embodiment, a semiconductor structure comprises a substrate, a bottom source/drain region disposed on a top surface of the substrate, a plurality of fins disposed over a top surface of the bottom source/drain region, the fins providing vertical transport channels for one or more vertical transport field-effect transistors, and at least one self-aligned shared contact disposed between an adjacent pair of the plurality of fins, the adjacent pair of the plurality of fins comprising a first fin providing a first vertical transport channel for a first vertical transport field-effect transistor and a second fin providing a second vertical transport channel for a second vertical transport field-effect transistor.

In another embodiment, an integrated circuit comprises one or more vertical transport field-effect transistors comprising a substrate, a bottom source/drain region disposed on a top surface of the substrate, a plurality of fins disposed over a top surface of the bottom source/drain region, the fins providing vertical transport channels for the one or more vertical transport field-effect transistors, and at least one self-aligned shared contact disposed between an adjacent pair of the plurality of fins, the adjacent pair of the plurality of fins comprising a first fin providing a first vertical transport channel for a first VTFET and a second fin providing a second vertical transport channel for a second VTFET.

In another embodiment, a method of forming a semiconductor structure comprises forming a bottom source/drain region over a top surface of a substrate, forming a plurality of fins over a top surface of the bottom source/drain region, the fins providing vertical transport channels for one or more vertical transport field-effect transistors, and forming at least one self-aligned shared contact between an adjacent pair of the plurality of fins, the adjacent pair of the plurality of fins comprising a first fin providing a first vertical transport channel for a first vertical transport field-effect transistor and a second fin providing a second vertical transport channel for a second vertical transport field-effect transistor.

DETAILED DESCRIPTION

Figure 1:
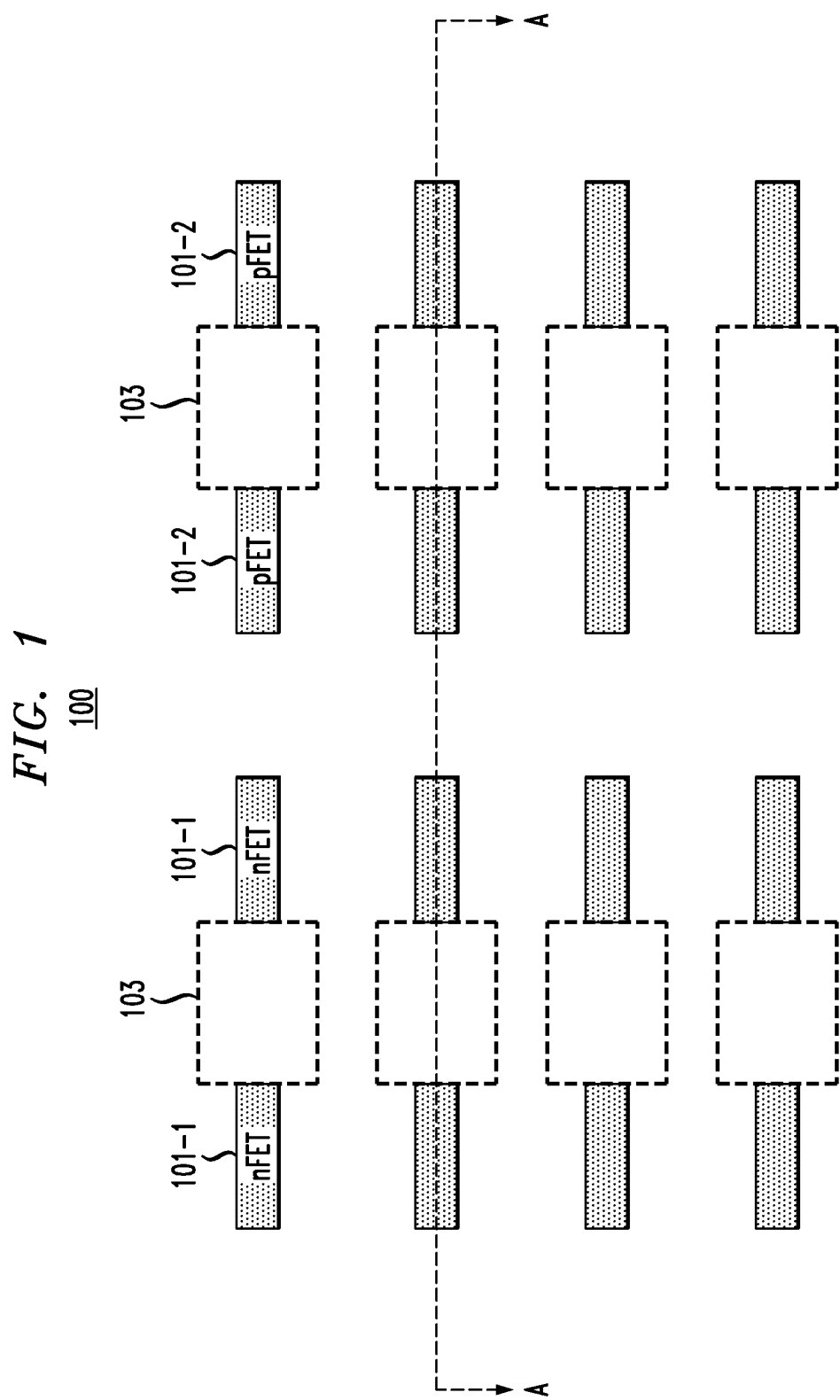
FIG. 1 depicts a top-down view of a set of n-type field-effect transistor (nFET) and p-type field-effect transistor (pFET) active regions along with block masks for forming a dummy gate between nFET-nFET and pFET-pFET regions, according to an embodiment of the invention.

Illustrative embodiments of the invention may be described herein in the context of illustrative methods for replacement metal gate processes for forming vertical transport field-effect transistors, along with illustrative apparatus, systems and devices formed using such methods. However, it is to be understood that embodiments of the invention are not limited to the illustrative methods, apparatus, systems and devices but instead are more broadly applicable to other suitable methods, apparatus, systems and devices.

A field-effect transistor (FET) is a transistor having a source, a gate, and a drain, and having action that depends on the flow of carriers (electrons or holes) along a channel that runs between the source and drain. Current through the channel between the source and drain may be controlled by a transverse electric field under the gate.

FETs are widely used for switching, amplification, filtering, and other tasks. FETs include metal-oxide-semiconductor (MOS) FETs (MOSFETs). Complementary MOS (CMOS) devices are widely used, where both n-type and p-type transistors (nFET and pFET) are used to fabricate logic and other circuitry. Source and drain regions of a FET are typically formed by adding dopants to target regions of a semiconductor body on either side of a channel, with the gate being formed above the channel. The gate includes a gate dielectric over the channel and a gate conductor over the gate dielectric. The gate dielectric is an insulator material that prevents large leakage current from flowing into the channel when voltage is applied to the gate conductor while allowing applied gate voltage to produce a transverse electric field in the channel.

Increasing demand for high density and performance in integrated circuit devices requires development of new structural and design features, including shrinking gate lengths and other reductions in size or scaling of devices. Continued scaling, however, is reaching limits of conventional fabrication techniques.

Vertical transport FETs (VTFETs) are being pursued as viable CMOS architectures for scaling to 7 nanometers (nm) and beyond. VTFETs provide the opportunity for further device scaling compared with other device architectures. However, several key device metrics are difficult to meet when forming VTFETs. Illustrative embodiments described herein provide an integration scheme to have replacement metal gate (RMG) with self-aligned gate cut and self-aligned bottom source/drain contacts. Advantageously, the self-aligned bottom source/drain contacts may be self-aligned to the gate cut for further device scaling.

Illustrative embodiments enable lateral dummy gate removal and gate conductor (e.g., work function metal (WFM)) fill for VTFETs. Some embodiments isolate all gates, which are self-aligned, and then pull out the nFET and pFET dummy gates separately using self-aligned cuts. Shared gates are then formed between nFET and pFET regions.

In some embodiments, the RMG process includes: forming a bottom junction or bottom source/drain region; forming an interlayer (IL) and dielectric (e.g., high-K or HK dielectric); forming a dummy gate; forming a top spacer; performing a self-aligned cut of the dummy gate; forming a top junction or top source/drain regions; performing a self-aligned cut of an interlevel dielectric (ILD) to pull the dummy gate laterally for nFET and pFET regions individually; performing a self-aligned cut to isolate the nFETs and pFETs individually by removing metals between the nFET-nFET (also referred to as n-n) and pFET-pFET (also referred to as p-p) regions; and opening the shared gate (also referred to as n-p) region and filling a metal to form an n-p shared gate CMOS structure. Such RMG processes are used to form RMG VTFETs, with a RMG gate with etched edge in like (e.g., n-n or p-p) regions, a bottom source/drain contact in like (e.g., n-n or p-p) regions between the etched RMG gate edges, bottom source/drain contacts in like (e.g., n-n or p-p) regions that are self-aligned to the cut RMG gate edges, and a RMG gate that is stripped in shared (e.g., n-p) regions. The nFET gate is electrically connected to the pFET gate with a strapping conductor that also connects to back-end-of-line (BEOL) wiring.

Illustrative processes for forming VTFETs using RMG processes with self-aligned gate cut and self-aligned bottom source/drain contacts will now be described with respect to FIGS. 1-25.

FIGS. 1-5 illustrate portions of the RMG process flow with top-down views, while FIGS. 6-25 illustrate portions of the RMG process flow with cross-sectional views. FIG. 1 shows a top down view 100 of sets of active regions 101-1 and 101-2 for nFET and pFET VTFETs, respectively. Also shown in the top-down view 100 is a block mask 103 for shared regions (e.g., nFET-nFET or n-n shared regions for the active regions 101-1 and pFET-pFET or p-p shared regions for the active regions 101-2). Also shown in FIG. 1 and subsequent top-down views in FIGS. 2-5 is a line A-A, illustrating where the cross-sectional views of FIGS. 6-25 are taken.

Figure 2:
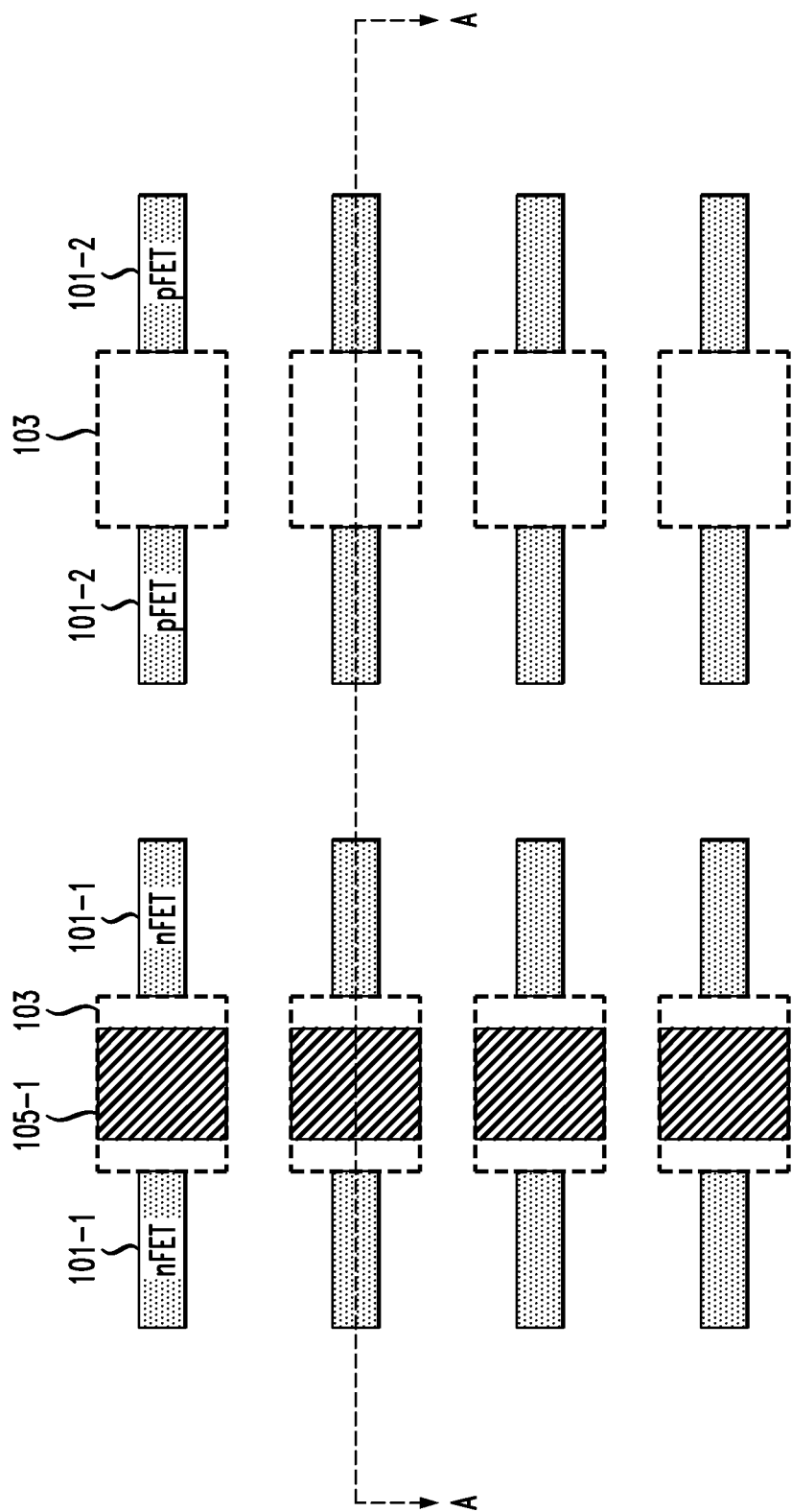
FIG. 2 depicts a top-down view of the FIG. 1 structure following a gate open for nFET dummy gate pull for nFET work function metal definition, according to an embodiment of the invention.
Figure 3:
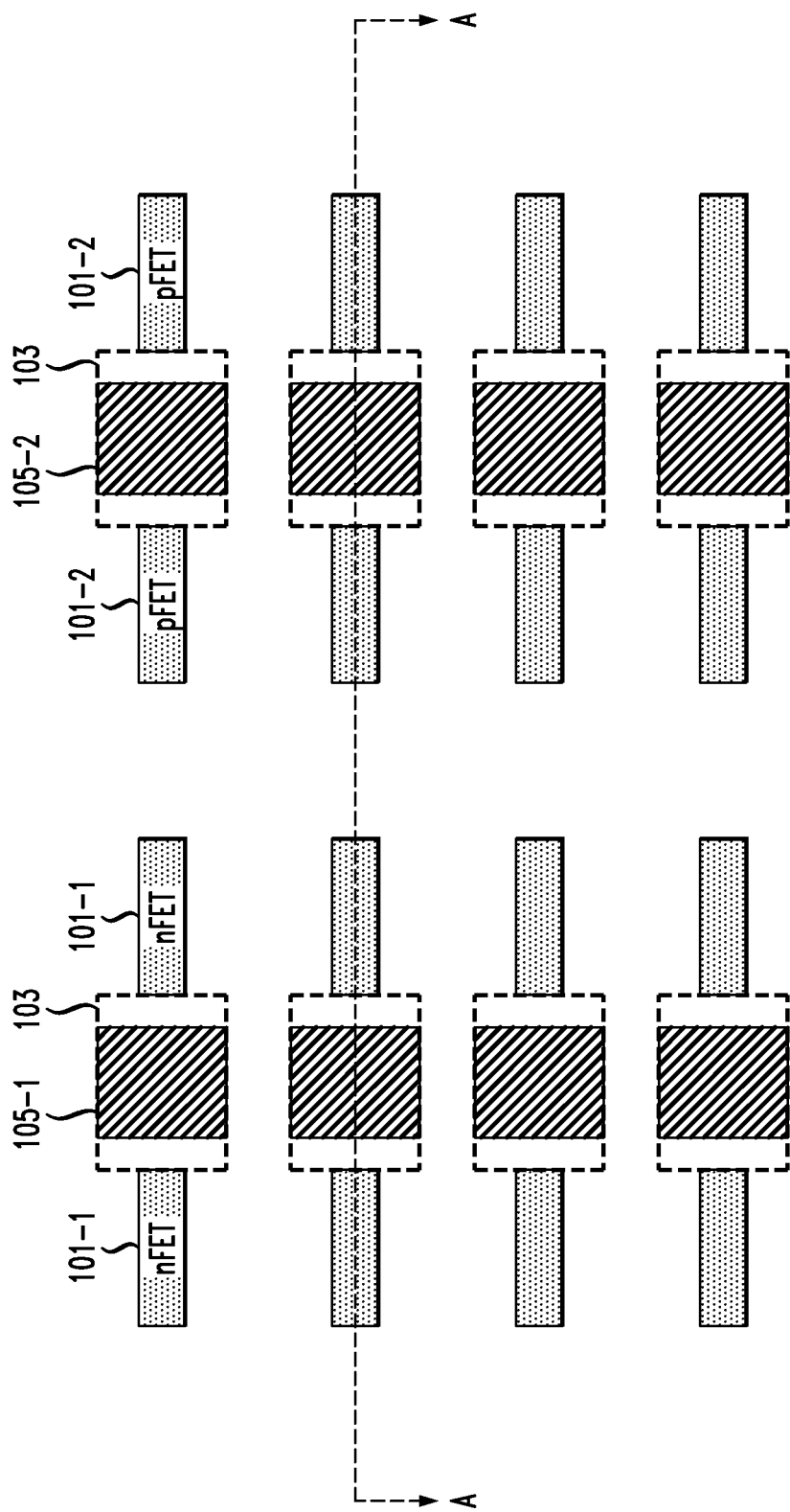
FIG. 3 depicts a top-down view of the FIG. 2 structure following a gate open for pFET dummy gate pull for pFET work function metal definition, according to an embodiment of the invention.

FIG. 2 depicts a top-down view 200 of the FIG. 1 structure following a gate open process in an open mask 105-1 inside the block mask 103 between the nFET active regions 101-1 for a dummy gate pull. FIG. 3 depicts a top-down view 300 of the FIG. 2 structure following a gate open process in the open mask 105-2 inside the block mask 103 between the pFET active regions 101-2 for the dummy gate pull. It should be appreciated that the ordering of the dummy gate pull is not limited to nFET followed by pFET. In other embodiments, the dummy gate pull may be performed for the pFET regions first followed by the nFET regions.

Figure 4:
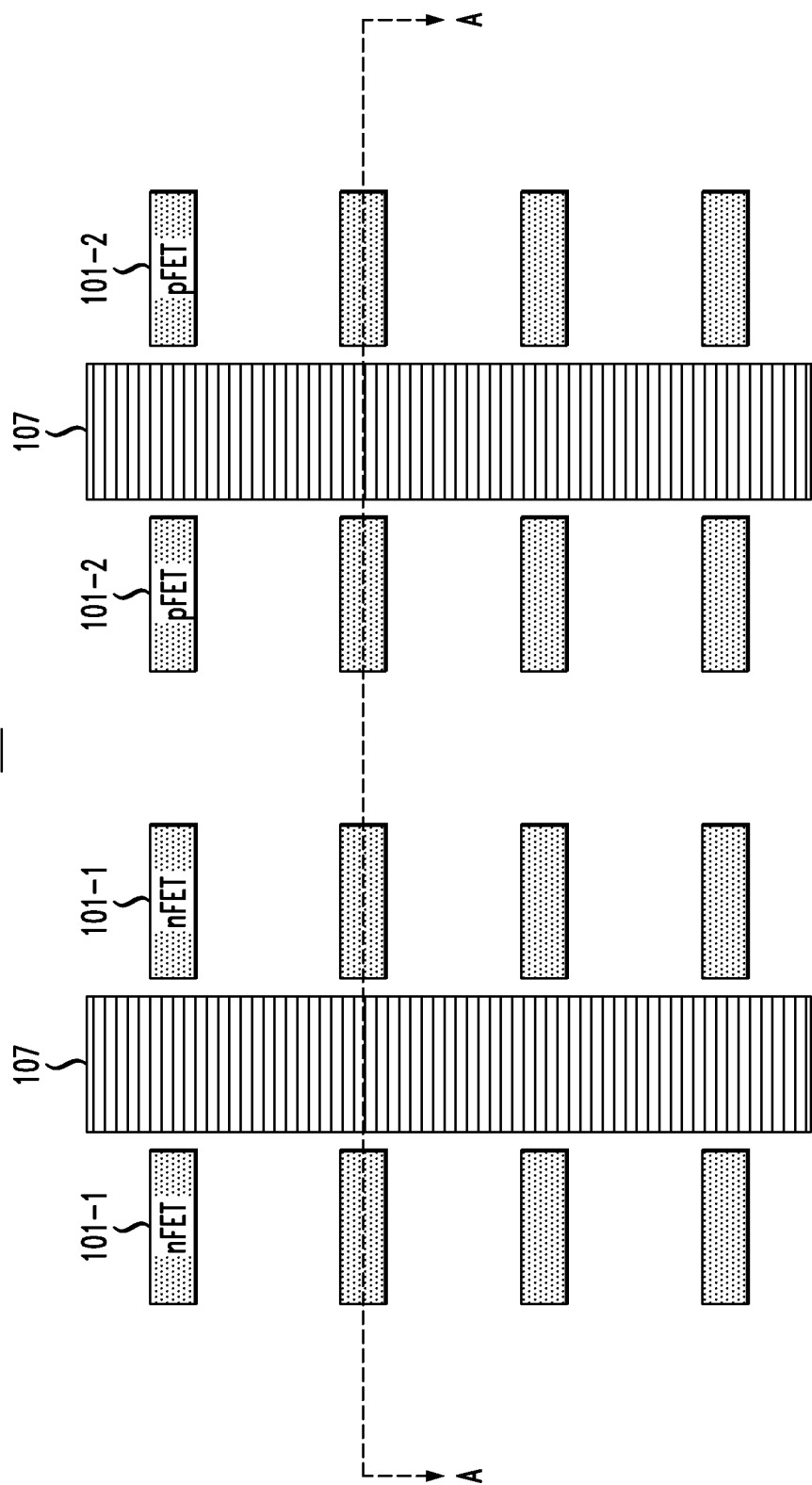
FIG. 4 depicts a top-down view of the FIG. 3 structure following a gate isolation cut between nFET-nFET or pFET-pFET by following an insulator filling, according to an embodiment of the invention.

FIG. 4 shows a top-down view 400 of the FIG. 2 structure following gate isolation 107, such as using reactive ion etching (RIE) or another suitable planarization process, followed by insulator filling and planarization.

Figure 5:
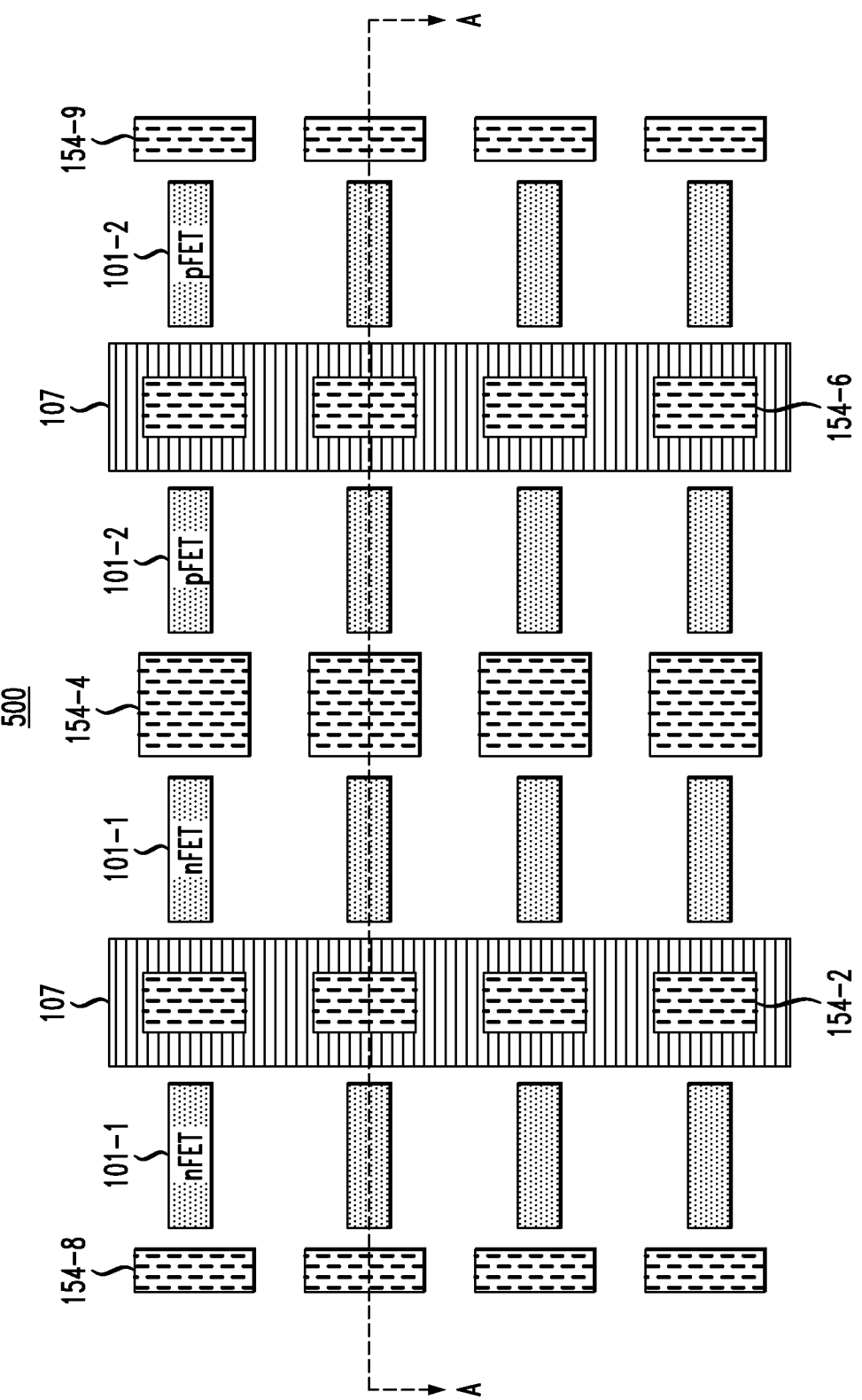
FIG. 5 depicts a top-down view of the FIG. 4 structure following a gate open to form a shared gate contact and following formation of self-aligned bottom source/drain contacts, according to an embodiment of the invention.

FIG. 5 shows a top-down view 500 of the FIG. 4 structure following a gate open in shared gate regions (e.g., the nFET-pFET or n-p regions) to form contacts 154-4 to the shared gate regions for respective "rows" of the nFET and pFET devices. It should be noted that although FIGS. 1-5 illustrate an arrangement with four "rows" of the nFET and pFET devices, embodiments are not so limited. More or fewer than four rows of nFET and pFET devices may be formed as desired.

The top-down view 500 further illustrates self-aligned bottom source/drain contacts 154-2 and 154-6 for the nFET active regions 101-1 and pFET active regions 101-2, respectively, and gate contacts 154-8 and 154-9 for nFET and pFET devices at the edges of each of the four rows. It should be noted that although FIGS. 1-5 illustrate two nFET and two pFET devices in each of the four rows, embodiments are not so limited. In other embodiments, more or fewer then two nFET and two pFET devices may be formed in each row, and there further may be different numbers of nFET and pFET devices in each row.

Additional details regarding the RMG process for forming VTFETs will now be described with respect to the cross-sectional views of FIGS. 6-25. The cross-sectional views of FIGS. 6-25, as indicated above, are taken along the line A-A in the top-down views of FIGS. 1-5 (e.g., along one of the "rows" where nFET and pFET VTFETs are formed).

Figure 6:
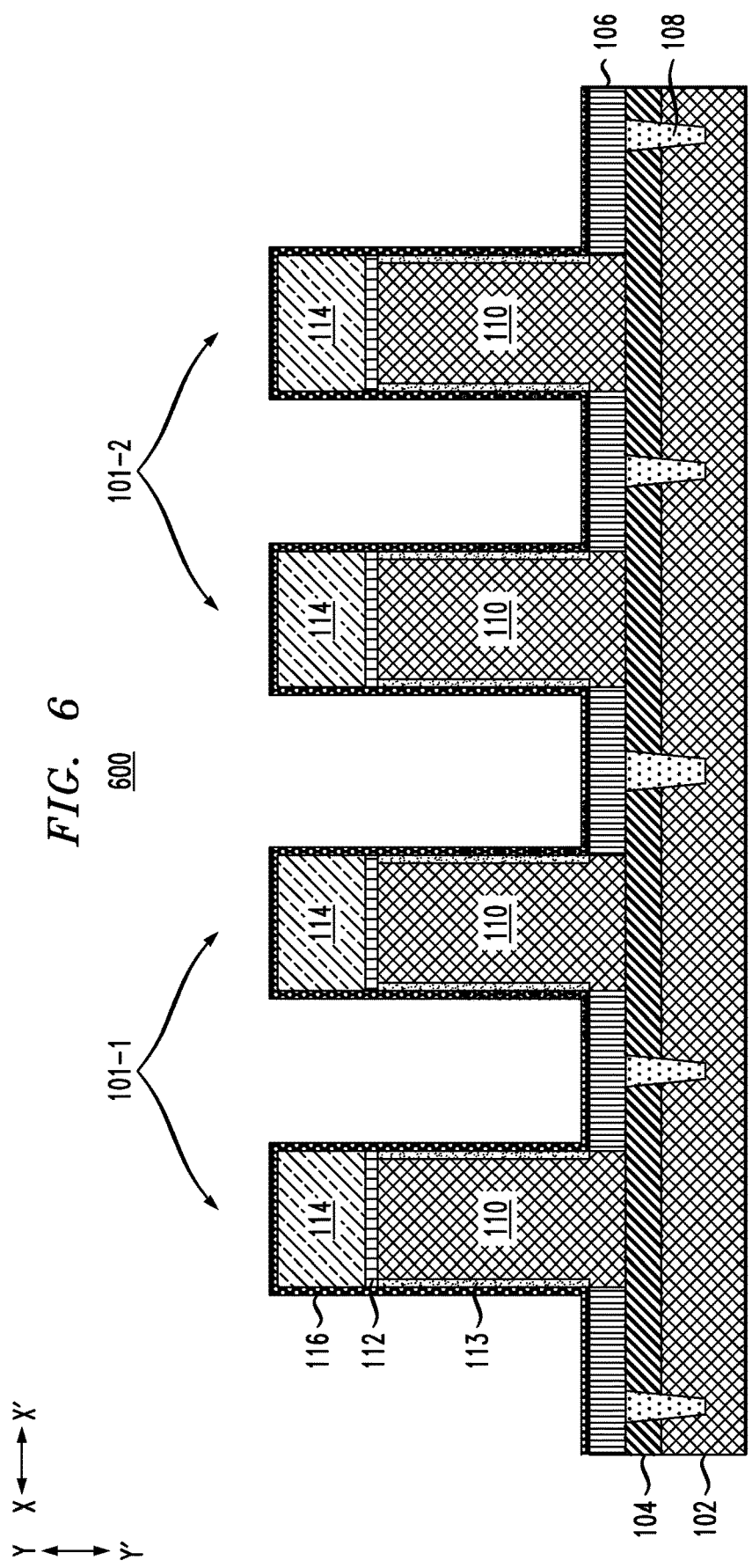
FIG. 6 depicts a cross-sectional view of a structure including a substrate, bottom source/drain regions, bottom spacer, fins, oxide, hard mask, interlayer and dielectric layer, according to an embodiment of the invention.

FIG. 6 shows a cross-sectional view 600 of a structure including a substrate 102, a bottom junction or bottom source/drain region 104, a bottom spacer 106, shallow trench isolations (STI) regions 108, fins 110, oxide layer 112, interfacial layer 113, hard masks 114, and dielectric layer 116.

The substrate 102 may comprise a semiconductor substrate formed of silicon (Si), although other suitable materials may be used. For example, the substrate 102 can include any suitable substrate structure, e.g., a bulk semiconductor. The substrate 102 can include a silicon-containing material. Illustrative examples of Si-containing materials suitable for the substrate 102 can include, but are not limited to, Si, silicon germanium (SiGe), silicon germanium carbide (SiGeC), silicon carbide (SiC) and multi-layers thereof. Although silicon is the predominantly used semiconductor material in wafer fabrication, alternative semiconductor materials can be employed as additional layers, such as, but not limited to, germanium (Ge), gallium arsenide (GaAs), gallium nitride (GaN), SiGe, cadmium telluride (CdTe), zinc selenide (ZnSe), etc.

The size of the substrate 102 may vary, such as based on the number of VTFETs that are to be formed thereon. The vertical thickness or height of the substrate (in direction Y-Y') may be in the range of 10 micrometers (µm) to 100 millimeters (mm), although other heights above or below this range may be used as desired for a particular application.

The bottom junction or bottom source/drain region 104 may be suitably doped, such as using ion implantation, gas phase doping, plasma doping, plasma immersion ion implantation, cluster doping, infusion doping, liquid phase doping, solid phase doping, etc. N-type dopants may be selected from a group of phosphorus (P), arsenic (As) and antimony (Sb), and p-type dopants may be selected from a group of boron (B), boron fluoride ($BF_2$), gallium (Ga), indium (In), and thallium (Tl). The bottom source/drain region 104 may be formed by an epitaxial growth process. In some embodiments, the epitaxy process comprises in-situ doping (dopants are incorporated in epitaxy material during epitaxy). Epitaxial materials may be grown from gaseous or liquid precursors. Epitaxial materials may be grown using vapor-phase epitaxy (VPE), molecular-beam epitaxy (MBE), liquid-phase epitaxy (LPE), rapid thermal chemical vapor deposition (RTCVD), metal organic chemical vapor deposition (MOCVD), ultra-high vacuum chemical vapor deposition (UHVCVD), low-pressure chemical vapor deposition (LPCVD), limited reaction processing CVD (LRP-CVD), or other suitable processes. Epitaxial silicon, silicon germanium (SiGe), germanium (Ge), and/or carbon doped silicon (Si:C) silicon can be doped during deposition (in-situ doped) by adding dopants, such as n-type dopants (e.g., phosphorus or arsenic) or p-type dopants (e.g., boron or gallium), depending on the type of transistor. The dopant concentration in the source/drain can range from $1\times10^{19}$ $cm^{-3}$ to $3\times10^{21}$ $cm^{-3}$, or preferably between $2\times10^{20}$ $cm^{-3}$ to $3\times10^{21}$ $cm^{-3}$.

The bottom source/drain region 104 may have a height or vertical thickness (in direction Y-Y') in the range of 10 nanometers (nm) to 100 nm, although other heights above or below this range may be used as desired for a particular application.

The bottom spacer 106 is formed over the bottom source/drain region 104, such as using non-conformal deposition and etch-back processing (e.g., physical vapor deposition (PVD), high density plasma (HDP) deposition, etc.). The bottom spacer 106 may be formed of $SiO_2$, SiN, silicon carbide oxide (SiCO), silicon boron carbide nitride (SiBCN), etc., although other suitable materials may be used. The bottom spacer 106 may have a height or vertical thickness (in direction Y-Y') in the range of 3 nm to 15 nm, although other heights above or below this range may be used as desired for a particular application.

The STI regions 108 may be formed of a dielectric material such as silicon dioxide ($SiO_2$), silicon oxycarbide (SiOC), silicon oxynitride (SiON), etc. The STI regions 108 isolate the bottom junction or bottom source/drain region 104 to provide separate addressability of the different VTFETs that are formed.

The fins 110 provide the vertical transport channels for the resulting VTFETs. The fins 110 may be formed of the same material as the substrate 102, and may be formed using sidewall image transfer (SIT) or other suitable techniques such as lithography and etching including reactive-ion etching (RIE), etc.

Each of the fins 110 may have a width or horizontal thickness (in direction X-X') in the range of 5 nm to 15 nm, although other widths above or below this range may be used as desired for a particular application. Each of the fins 110 may have a height or vertical thickness (in direction Y-Y') ranging from 15 nm to 100 nm, although other heights above or below this range may be used as desired for a particular application. A spacing between adjacent ones of the fins 110 may be in the range of 20 nm to 60 nm, although other spacing may be used as desired for a particular application.

An oxide layer 112 is formed over each of the fins 110. The oxide layer 112 may be formed of silicon oxide ($SiO_x$) or another suitable material such as silicon oxynitride (Si- $O_xN_y$), silicon oxycarbide (SiOC), etc. The oxide layer 112 may have a height or vertical thickness (in direction Y-Y') ranging from 1 nm to 5 nm, although other heights above or below this range may be used as desired for a particular application.

The interfacial layer 113 is formed on sidewalls of the fins 110. The interfacial layer 113 may be formed of $SiO_2$ or another suitable material such as $SiO_xN_y$. The interfacial layer 113 may have a width or horizontal thickness (in direction X-X') ranging from 0.5 nm to 1.5 nm, although other widths above or below this range may be used as desired for a particular application. For clarity of illustration, the interfacial layer 113 is not shown in subsequent FIGS. 7-25, although it is assumed that the interfacial layer 113 is present in the structures shown in FIGS. 7-25.

Hard masks 114, also referred to herein as HM 114, are formed over the oxide 112 on top of each of the fins 110. The HM 114 may be formed of a nitride such as silicon nitride (SiN) or another suitable material. The HM 114 may have a height or vertical thickness (in direction Y-Y') in the range of 20 nm to 80 nm, although other heights above or below this range may be used as desired for a particular application. The HM 114 may be patterned over an initial substrate, with the resulting substrate 102 being formed by etching in the regions exposed by the HM 114 to form the fins 110 from the initial substrate. In some embodiments, the HM 114 may be formed as a multilayer, such as two layers of materials including a nitride and oxide (e.g., $SiN/SiO_2$), or three layers of nitride and oxide materials such as (e.g., $SiN/SiO_2/SiN$, $SiO_2/SiN/SiO_2$), etc.

The dielectric layer 116 is formed over the entire structure as illustrated in FIG. 6. The dielectric layer 116 provides the gate dielectric for the resulting VTFETs. The dielectric layer 116 may be formed of a high-k dielectric material. Examples of high-k materials include but are not limited to metal oxides such as hafnium oxide ($HfO_2$), hafnium silicon oxide (Hf—Si—O), hafnium silicon oxynitride (HfSiON), lanthanum oxide ($La_2O_3$), lanthanum aluminum oxide ($LaAlO_3$), zirconium oxide ($ZrO_2$), zirconium silicon oxide, zirconium silicon oxynitride, tantalum oxide ($Ta_2O_5$), titanium oxide ($TiO_2$), barium strontium titanium oxide, barium titanium oxide, strontium titanium oxide, yttrium oxide ($Y_2O_3$), aluminum oxide ($Al_2O_3$), lead scandium tantalum oxide, and lead zinc niobate. The high-k material may further include dopants such as lanthanum (La), aluminum (Al), and magnesium (Mg). The dielectric layer 116 may have a uniform thickness in the range of 1 nm to 3 nm, although other thicknesses above or below this range may be used as desired for a particular application.

Figure 7:
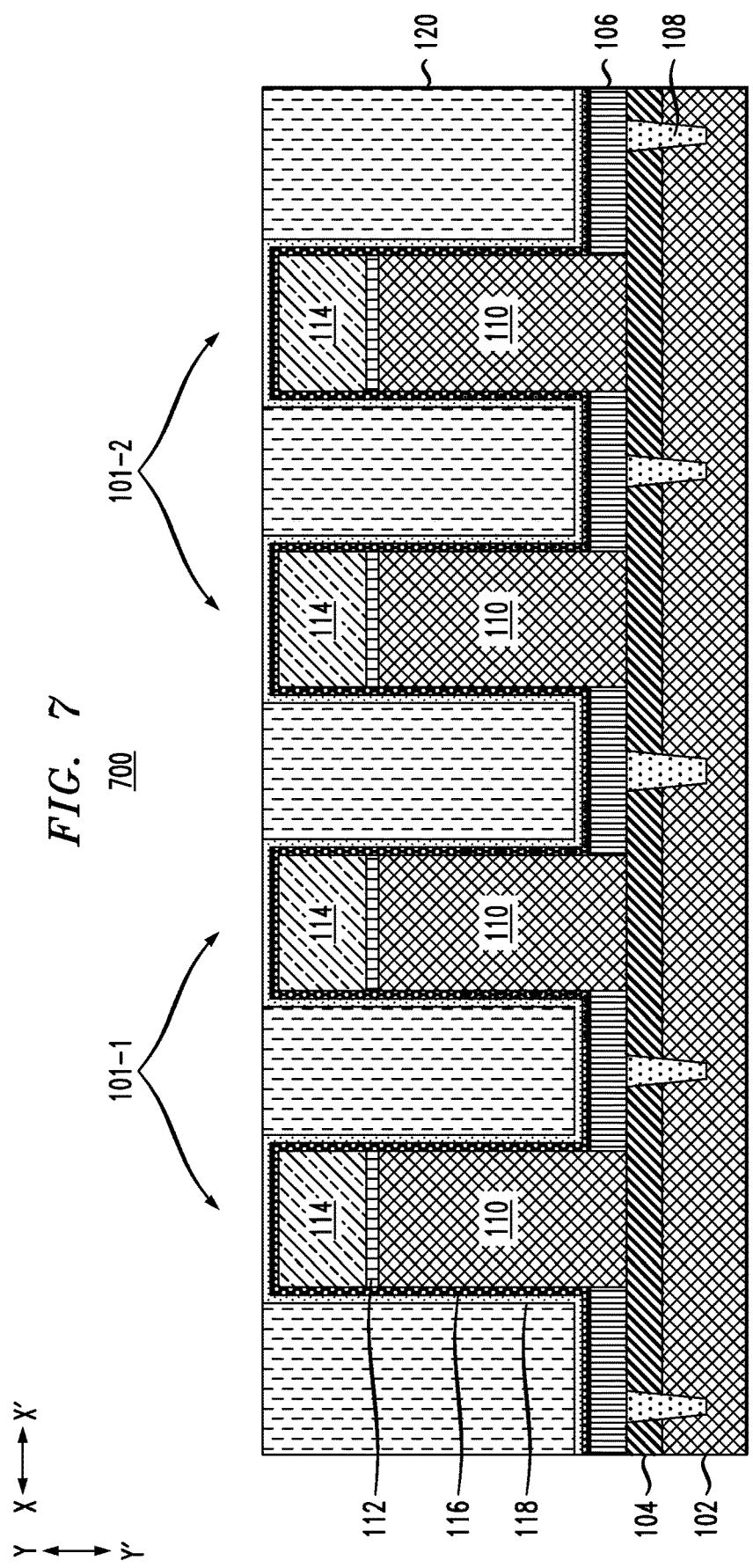
FIG. 7 depicts a cross-sectional view of the FIG. 6 structure following formation of a capping layer and formation of a dummy gate after planarization, according to an embodiment of the invention.

FIG. 7 shows a cross-sectional view 700 of the FIG. 6 structure following formation of a capping layer 118 and formation of a dummy gate 120. The capping layer 118 may be deposited over the dielectric layer 116. The capping layer 118 may be formed of titanium nitride (TiN) or another suitable material such as tantalum nitride (TiN), titanium silicon nitride (TiSiN), etc. The capping layer 118 may have a uniform thickness in the range of 1 nm to 5 nm, although other thicknesses above or below this range may be used as desired for a particular application.

The dummy gate 120 may initially be deposited to fill the structure, and then planarized using CMP or another suitable process such that a top surface of the dummy gate 120 is substantially coplanar with that of the capping layer 118. The dummy gate 120 may be formed of amorphous silicon (a-Si), amorphous silicon germanium (a-SiGe), $SiO_2$, titanium nitride (TiN) or another suitable material.

Figure 8:
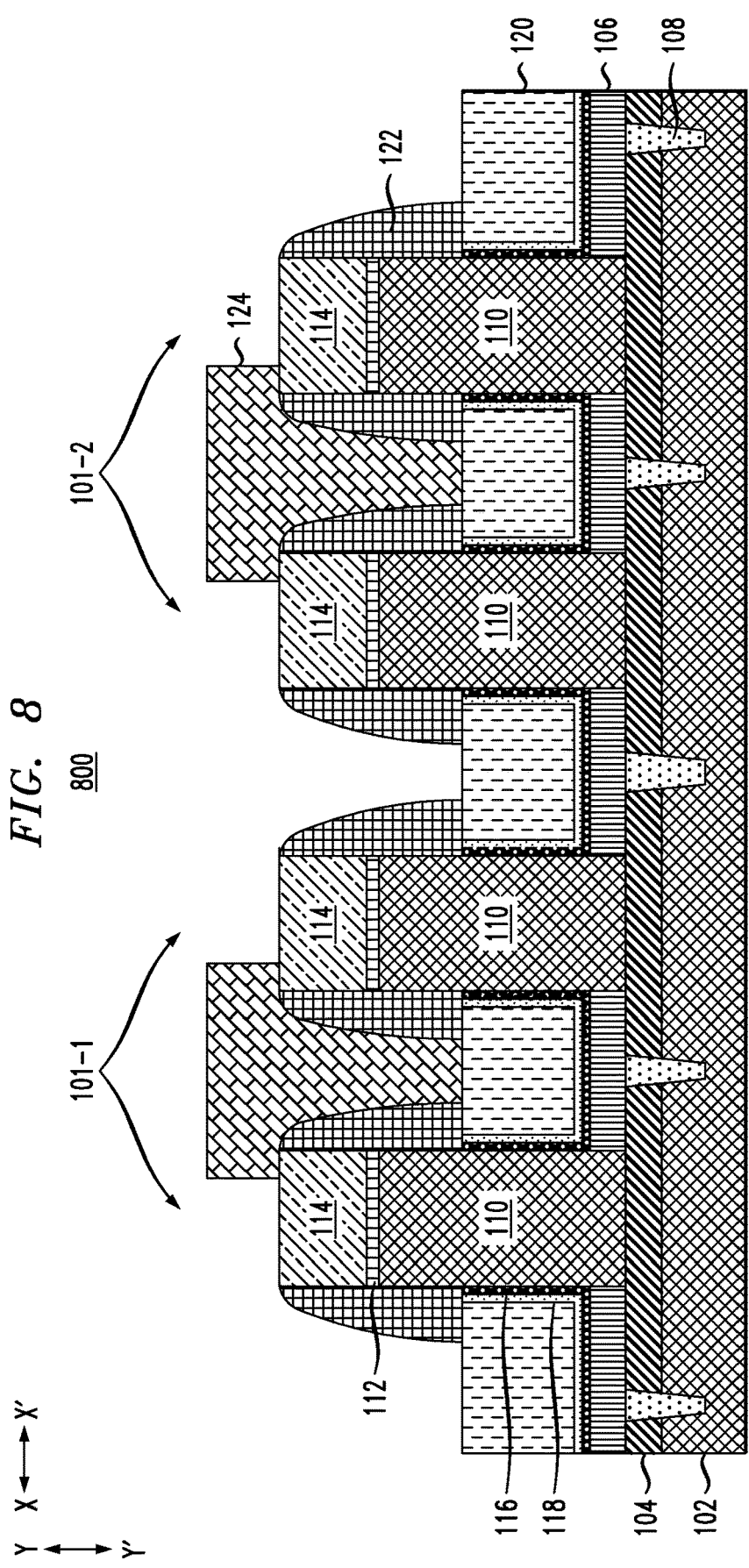
FIG. 8 depicts a cross-sectional view of the FIG. 7 structure following recess of the dummy gate, capping layer and dielectric layer, formation of a self-aligned spacer and formation of masks in the nFET-nFET and pFET-pFET shared regions as shown in FIG. 1, according to an embodiment of the invention.

FIG. 8 shows a cross-sectional view 800 of the FIG. 7 structure following recess of the dummy gate 120, capping layer 118 and dielectric layer 116, formation of self-aligned spacers 122 and following formation of masks 124 in the n-n and p-p shared regions.

The dummy gate 120 may be recessed using chemical or reactive-ion etching (RIE) processes. The capping layer 118 and dielectric layer 116 may be recessed using RIE or another suitable process. Following recess, the vertical thickness or height of the dummy gate 120, capping layer 118 and dielectric layer 116 is below a top surface of the fins 110. For example, the height of the dielectric layer 116 on sidewalls of the fins 110, measured from a top surface of the bottom spacer 106, may be in the range of 10 nm to 60 nm, although other heights above or below this range may be used as desired for a particular application so long as the dielectric layer 116, capping layer 118 and dummy gate 120 are recessed below a top surface of the fins 110.

Self-aligned spacers 122 are formed on exposed sidewalls of the fins 110, oxide 112 and HM 114 as illustrated in FIG. 8. Formation of the self-aligned spacers may be achieved through a conformal deposition followed by RIE. The self-aligned spacers 122 may be formed of a nitride such as SiBCN, SiOC, SiCN, etc. At their widest points (e.g., proximate the top surface of the recessed dummy gate 120), the self-aligned spacers 122 have a width or horizontal thickness (in direction X-X') ranging from 10 nm to 20 nm. The width then tapers proximate the top surface of the HM 114 to a width or horizontal thickness (in direction X-X') ranging from 1 nm to 6 nm. The width of the self-aligned spacers 122 at their widest and narrowest points may vary above or below these ranges as desired for a particular application, although there should be sufficient spacing between the self-aligned spacers 122 for the self-aligned cuts in the n-p, n-n and p-p shared regions described in further detail below.

The masks 124 cover the n-n and p-p shared regions as illustrated in FIG. 8. The materials used for the mask 124 may be a soft mask, such as an organic planarization layer (OPL), or a hard mask, such as TiN, SiO, etc. The widths of the masks 124 are such that each mask should fully cover the bottom space of the adjacent spacer 122.

Figure 9:
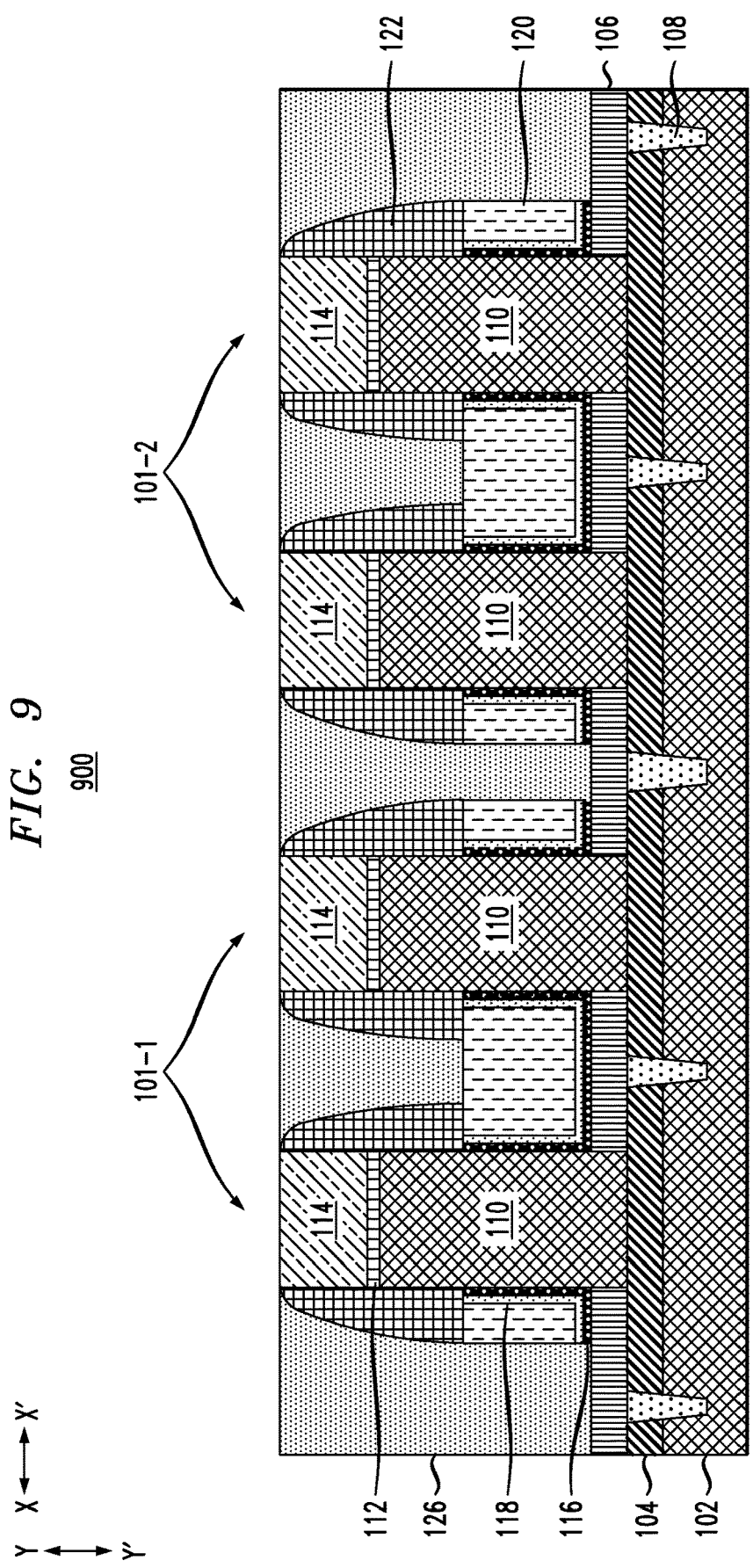
FIG. 9 depicts a cross-sectional view of the FIG. 8 structure following a self-aligned cut of the dummy gate, oxide fill and planarization of the oxide to stop on the hard mask, according to an embodiment of the invention.

FIG. 9 shows a cross-sectional view 900 of the FIG. 8 structure following a self-aligned cut of the dummy gate 120 in the n-p shared region, and following fill and planarization of an oxide layer 126.

The self-aligned cut of the dummy gate 120 in the n-p shared region removes portions of the dummy gate 120 not covered by the self-aligned spacers 122, HM 114 or masks 124. Thus, as illustrated, the dummy gate 120 in the n-p shared region is removed below the adjacent self-aligned spacers 122. In addition, the dummy gate 120 is removed in regions at the edge of the structure outside the self-aligned spacers 122.

An oxide is then filled over the structure, and planarized using CMP or other suitable processing to form oxide layer 126. In some embodiments, an additional encapsulation layer (not shown in FIG. 9) is formed over the structure prior to formation of the oxide layer 126. The oxide layer 126 is planarized such that its top surface is substantially coplanar with the top surface of the HM 114.

Figure 10:
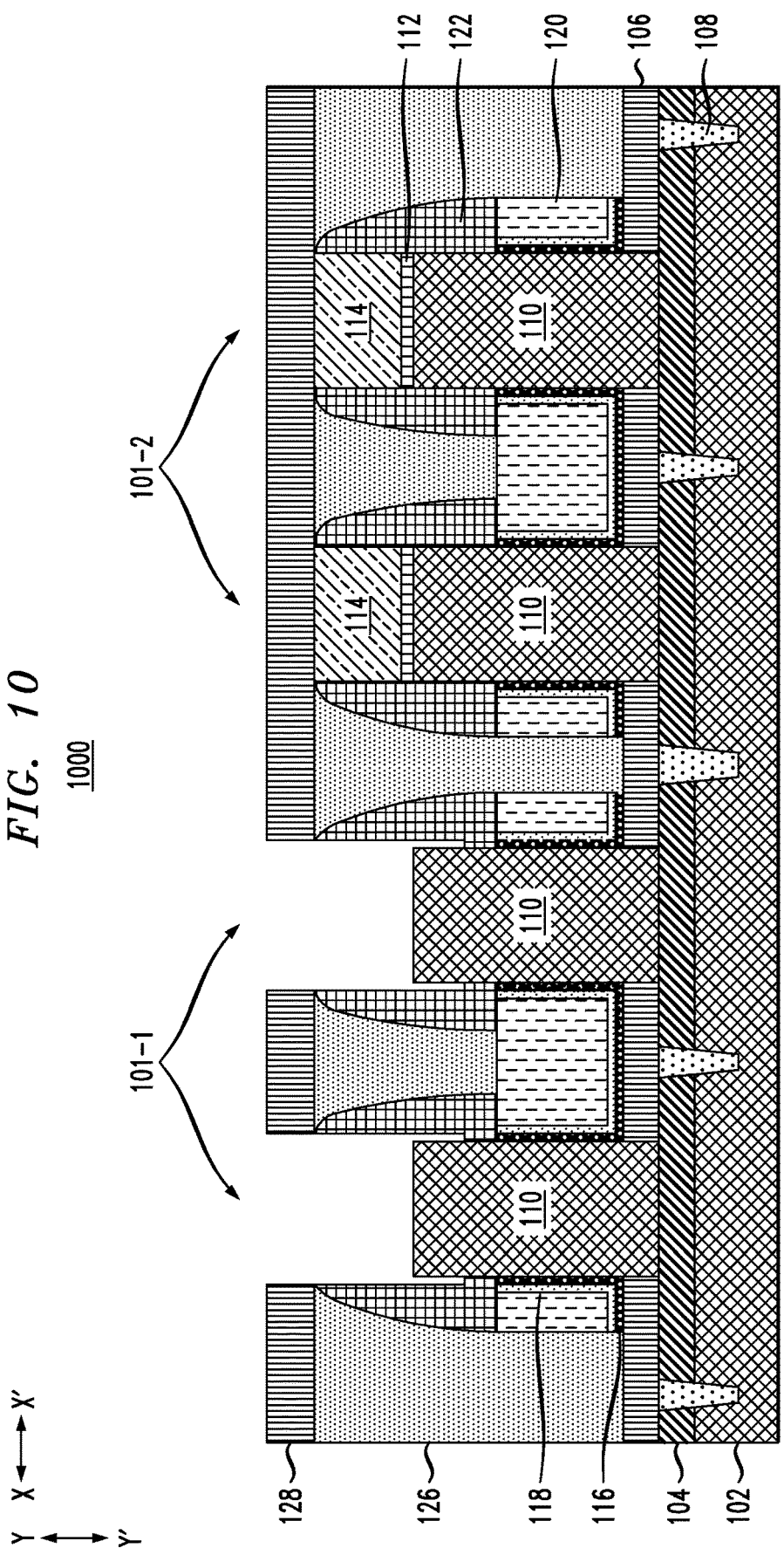
FIG. 10 depicts a cross-sectional view of the FIG. 9 structure following formation of a mask to open top junctions for the nFET regions, according to an embodiment of the invention.

FIG. 10 shows a cross-sectional view 1000 of the FIG. 9 structure following patterning of a mask 128 over the structure and following opening of the nFET top junction (e.g., exposing top surfaces of the fins 110 in the nFET active regions 101-1) for subsequent epitaxial growth of top source/drain regions for the nFET VTFETs. The mask 128 may be formed of SiN or another suitable material, and may be patterned using RIE or other suitable processing. As illustrated, the openings in the mask 128 are wider (e.g., in the range of 5 nm to 10 nm) than that of the top surface of the fins 110 in the nFET active regions 101-1 such that portions of the self-aligned spacers 122 adjacent the fins 110 in the nFET active regions 101-1 are removed during the top junction open. This, however, is not a requirement, and the mask 128 may be patterned such that only the HM 114 over the top surface of the fins 110 is removed and not portions of the self-aligned spacers 122 so long as good epitaxial growth may be achieved after such patterning. The HM 114 and portions of the self-aligned spacers adjacent the fins 110 in the nFET active regions 101-1 are removed using RIE and wet etch or other suitable processing.

Figure 11:
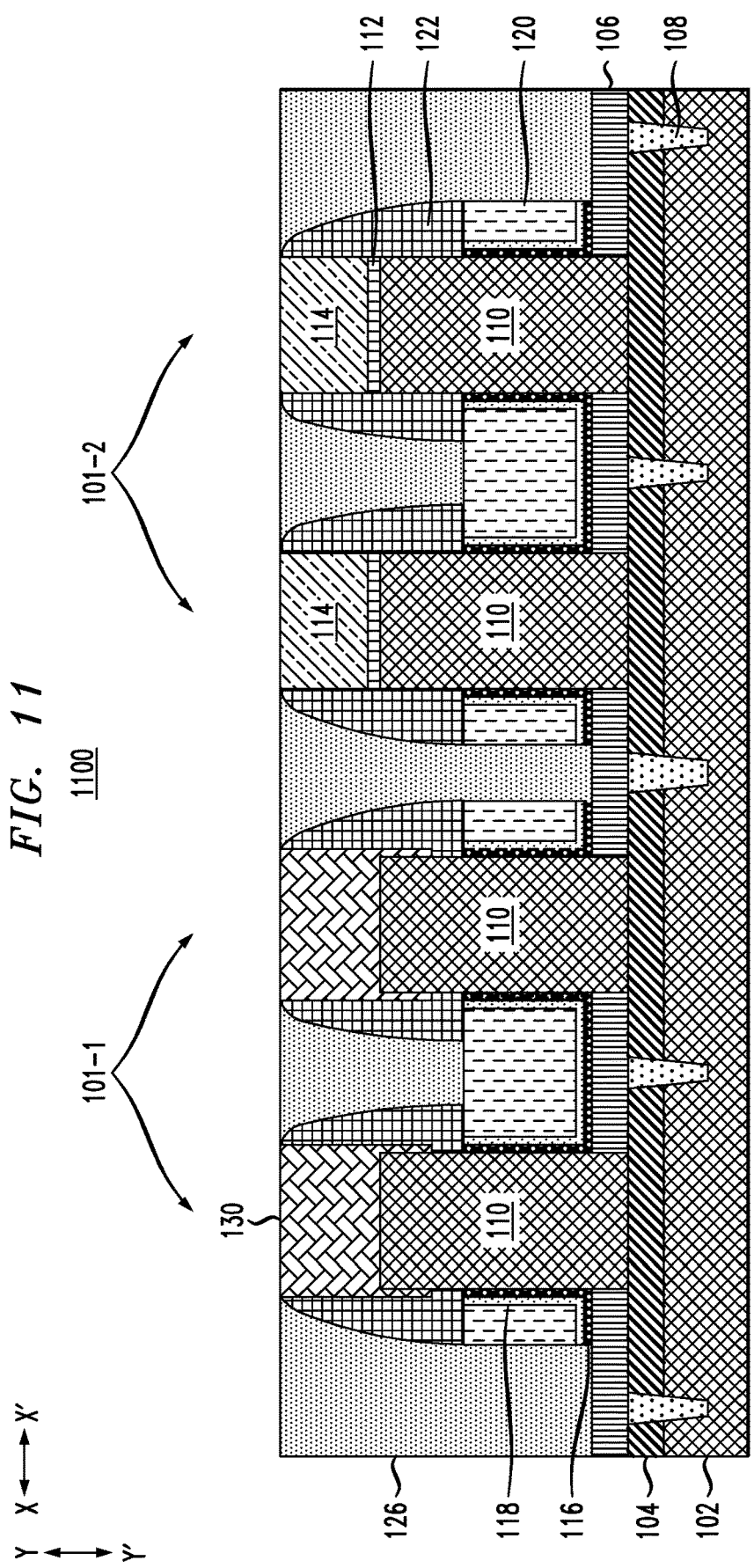
FIG. 11 depicts a cross-sectional view of the FIG. 10 structure following formation of nFET top source/drain regions, according to an embodiment of the invention.

FIG. 11 shows a cross-sectional view 1100 of the FIG. 10 structure following formation of top junctions or top source/drain regions 130 for the nFET VTFETs. The top source/drain regions 130 may be formed using processing similar to that described above with respect to formation of the bottom source/drain region 104. The top source/drain regions 130 utilize n-type dopants. The mask 128 is removed using, RIE, wet etch, and/or CMP or other suitable processing.

Figure 12:
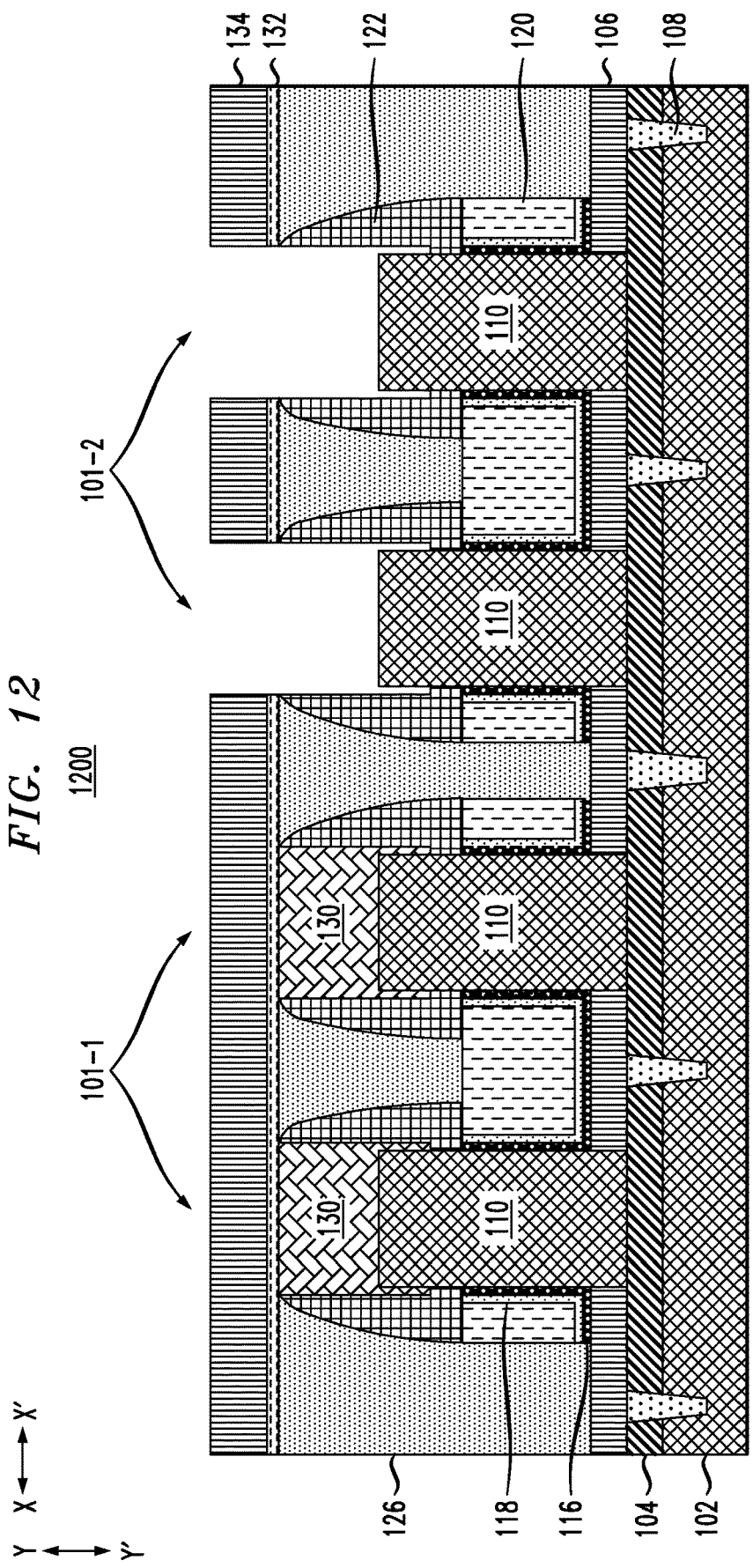
FIG. 12 depicts a cross-sectional view of the FIG. 11 structure following formation of an encapsulation layer and mask to open top junctions for the PFET regions, according to an embodiment of the invention.

FIG. 12 shows a cross-sectional view 1200 of the FIG. 11 structure following formation of an encapsulation layer 132 to protect the nFET top source/drain regions 130 during formation of the pFET top source/drain regions. The encapsulation layer 132 may be formed of a nitride such as SiN or another suitable encapsulating material.

A mask 134 is then patterned over the structure to open the pFET top junction (e.g., exposing top surfaces of the fins 110 in the pFET active regions 101-2) for subsequent epitaxial growth of the top source/drain regions for the pFET VTFETs. The mask 134 may be formed of similar materials and with similar processing as that described above with respect to mask 128. Also similar to mask 128, the openings in the mask 132 are wider (e.g., in the range of 5 nm to 10 nm) than that of the top surface of the fins 110 in the pFET active regions 101-2 such that portions of the self-aligned spacers 122 adjacent the fins 110 in the pFET active regions 101-2 are removed during the top junction open. Again, it should be noted that this is not a requirement and that the mask 134 may be patterned such that only the HM 114 is removed and not portions of the self-aligned spacers 122 so long as good epitaxial growth may be achieved during later processing described below. The HM 114 and portions of the self-aligned spacers adjacent the fins 110 in the pFET active regions 101-1 are removed using RIE and wet etch or other suitable processing.

Figure 13:
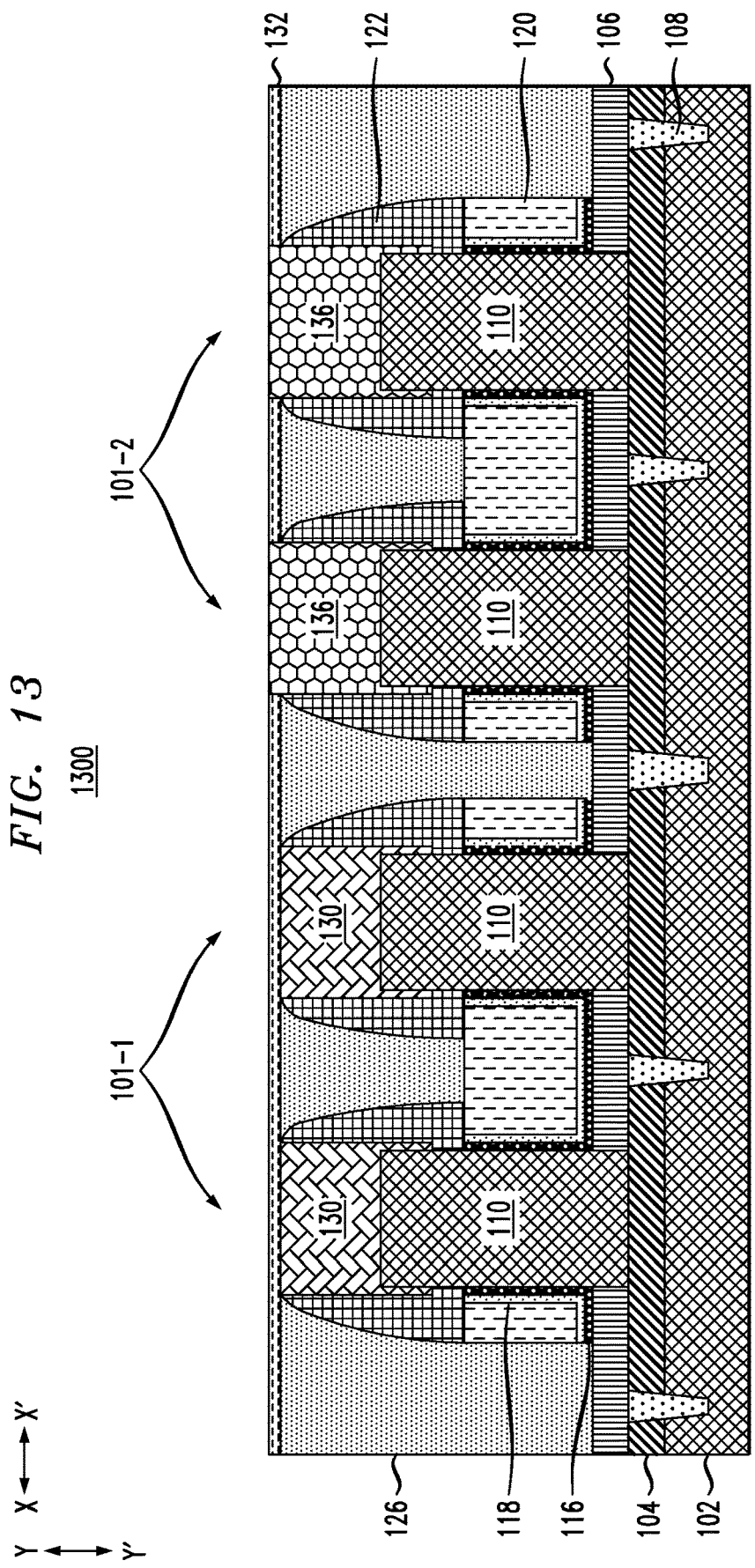
FIG. 13 depicts a cross-sectional view of the FIG. 12 structure following formation of pFET top source/drain regions, according to an embodiment of the invention.

FIG. 13 shows a cross-sectional view 1300 of the FIG. 12 structure following formation of the top junctions or top source/drain regions 136 for the pFET VTFETs. The top source/drain regions 136 may be formed using processing similar to that described above with respect to formation of the bottom source/drain region 104. The top source/drain regions 136 utilize p-type dopants. The mask 134 is removed using processing similar to that described above with respect to removal of the mask 128.

It should be appreciated that while FIGS. 10-13 illustrate a process wherein the nFET top source/drain regions 130 are formed prior to the pFET top source/drain regions 136, embodiments are not so limited. In other embodiments, this processing may be reversed such that the pFET top source/drain regions 136 are formed prior to the nFET top source/drain regions 130.

Figure 14:
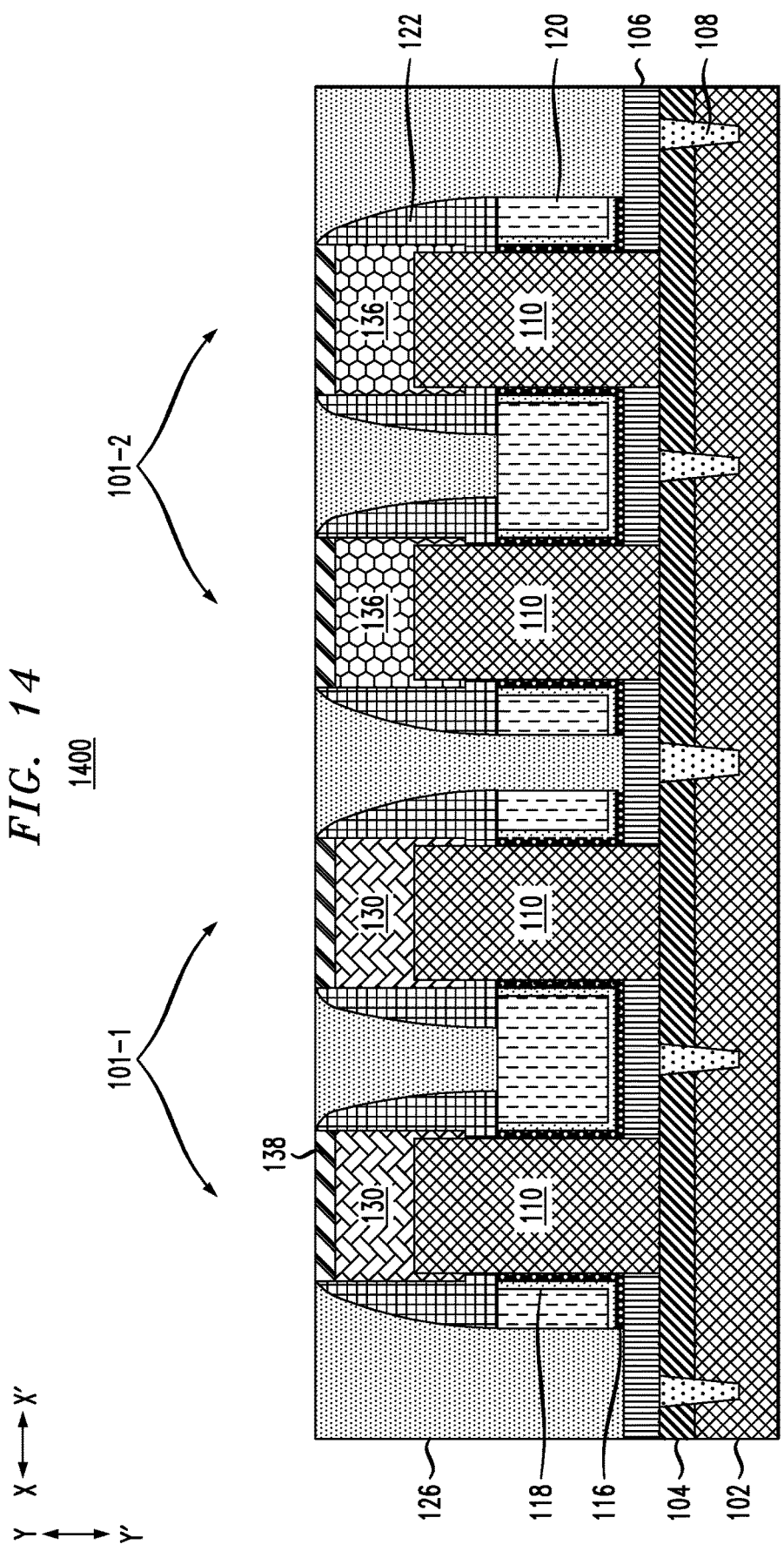
FIG. 14 depicts a cross-sectional view of the FIG. 13 structure following removal of the encapsulation layer, recessing the nFET and pFET top source/drain regions, and formation of nitride layer on the top junctions, according to an embodiment of the invention.

FIG. 14 shows a cross-sectional view 1400 of the FIG. 13 structure following removal of the encapsulation layer 132 and formation of a nitride layer 138 over the nFET top source/drain regions 130 and the pFET top source/drain regions 136. The encapsulation layer 132 may be removed using wet etch or other suitable processing. The nitride layer 138 may be formed by recessing the nFET top source/drain regions 130 and pFET top source/drain regions 136 followed by deposition or in-situ nitridization.

Figure 15:
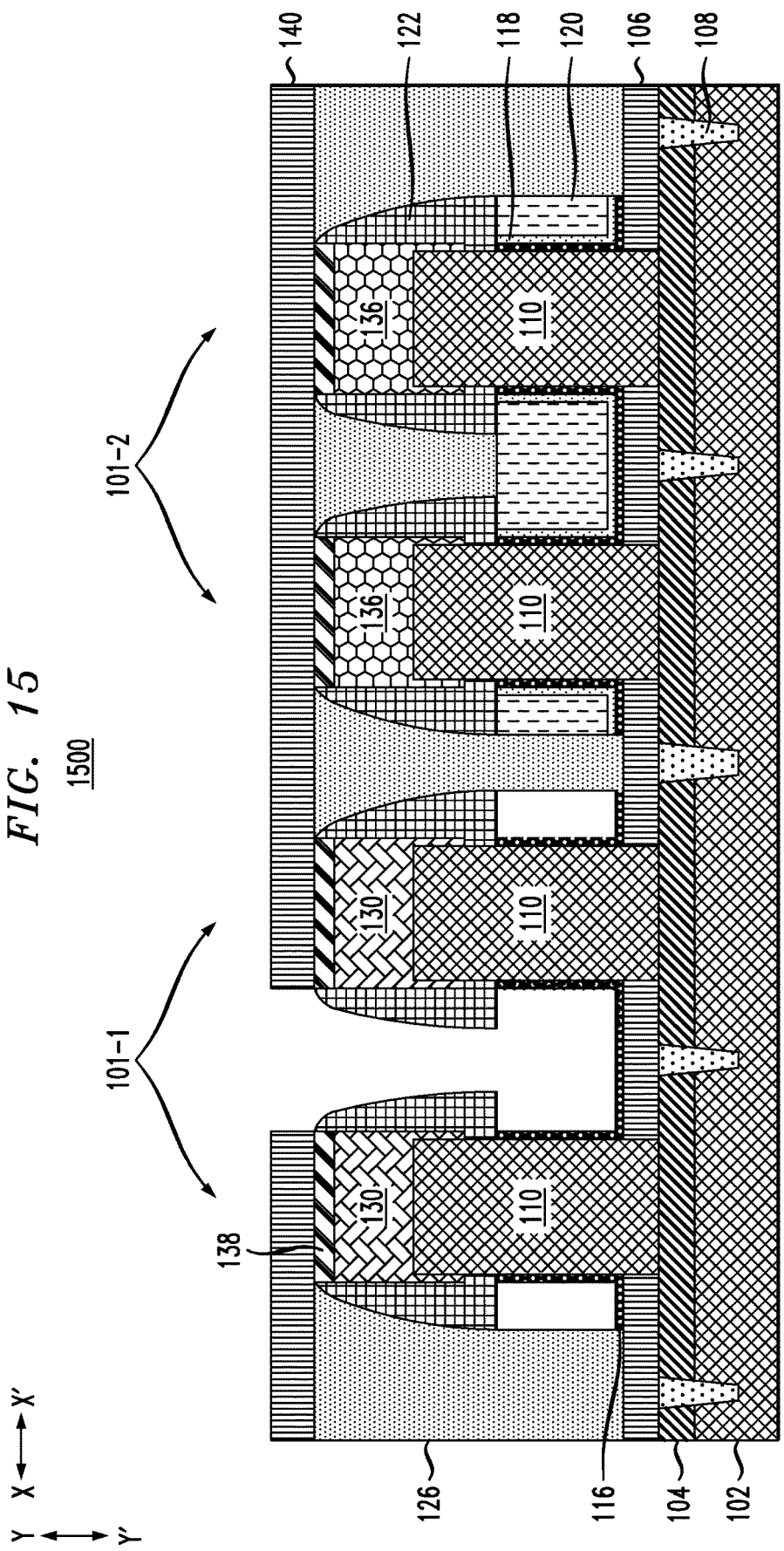
FIG. 15 depicts a cross-sectional view of the FIG. 14 structure following formation of a mask to open the nFET-nFET shared region and following removal of the dummy gate in the nFET-nFET shared region, according to an embodiment of the invention.

FIG. 15 shows a cross-sectional view 1500 of the FIG. 14 structure following formation of a mask 140 to open the n-n shared region, and following removal of the dummy gate 120 in the n-n shared region. The mask 140 may be formed of similar materials and with similar processing as mask 128. The mask 140 is patterned as illustrated to provide an opening between the fins 110 in the nFET active regions 101-1. Portions of the oxide layer 126 exposed by the mask 140 are then removed using RIE or other suitable processing. The dummy gate 120 in the n-n shared region is then removed using dry or wet etch processing. The capping layer 118 is also removed as illustrated, though the dielectric layer 116 remains to provide the gate dielectric as discussed above.

Figure 16:
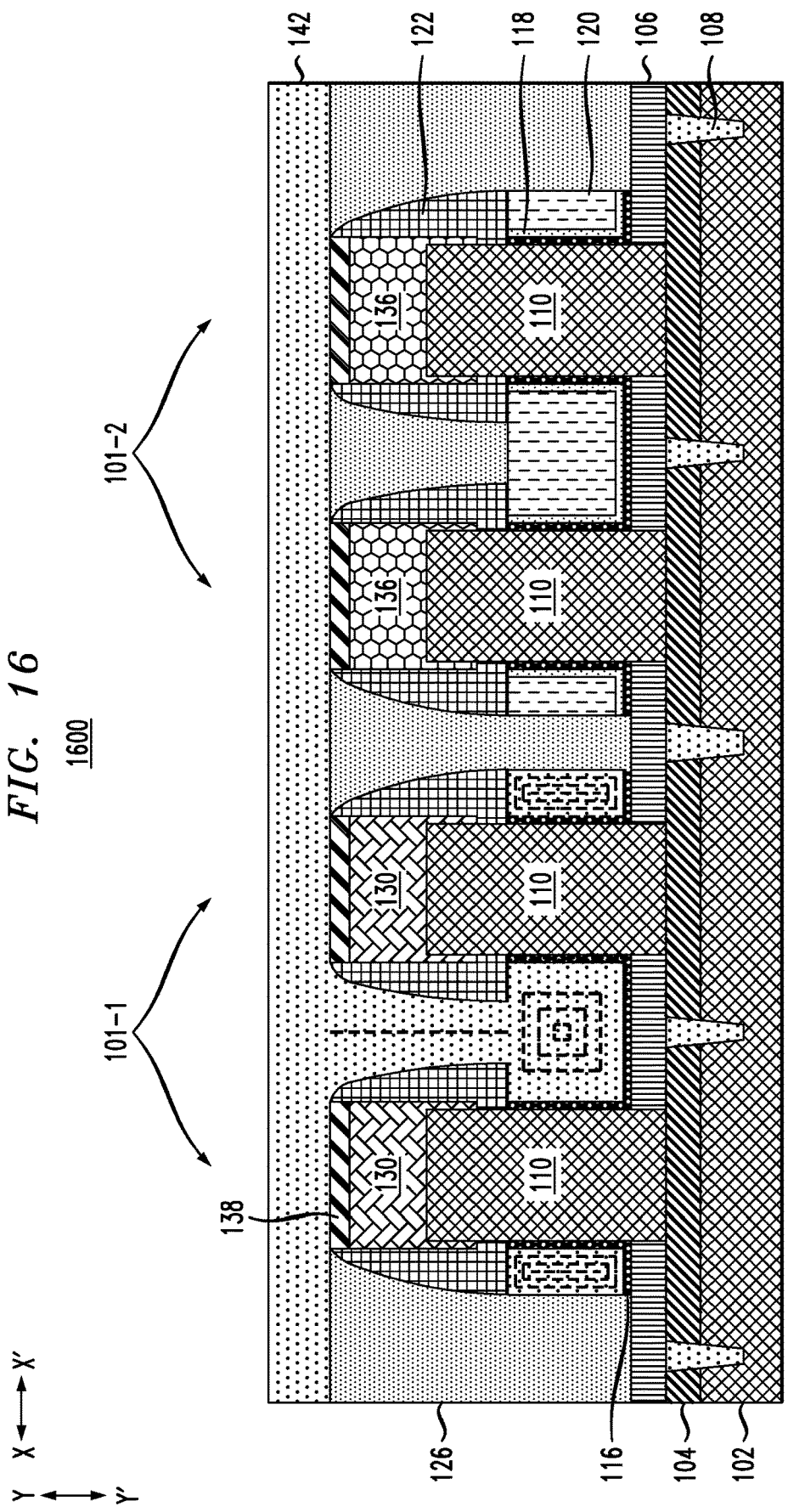
FIG. 16 depicts a cross-sectional view of the FIG. 15 structure following formation of an nFET gate conductor, according to an embodiment of the invention.

FIG. 16 shows a cross-sectional view 1600 of the FIG. 15 structure following formation of a gate conductor 142 for the nFET VTFETs. The mask 140 is removed prior to formation of the nFET gate conductor 142, using processing similar to that described above with respect to removal of the mask 128.

The nFET gate conductor 142 may be formed of a WFM, and thus may also be referred to herein as nFET WFM 142. The nFET WFM 142 may be titanium (Ti), aluminum (Al), titanium aluminum (TiAl), titanium aluminum carbon (TiAlC), a combination of Ti and Al alloys, a stack which includes a barrier layer (e.g., of TiN or another suitable material) followed by one or more of the aforementioned WFM materials, etc. The nFET gate conductor 142, also referred to as nFET WFM 142, may be formed using a conformal deposition process such as ALD. As illustrated by the bold dashed lines in FIG. 16, formation of the nFET WFM 142 may include ALD deposition from both sides layer-by-layer, with subsequent layers pinching off the remaining space until the region is completely filled as illustrated. This layer-by-layer deposition of the nFET WFM 142 may result in seams as indicated by the bold dashed lines in FIG. 16. The layer by layer deposition by ALD could form a metal layer ring due to lateral tunneling deposition as shown in FIG. 16.

Figure 17:
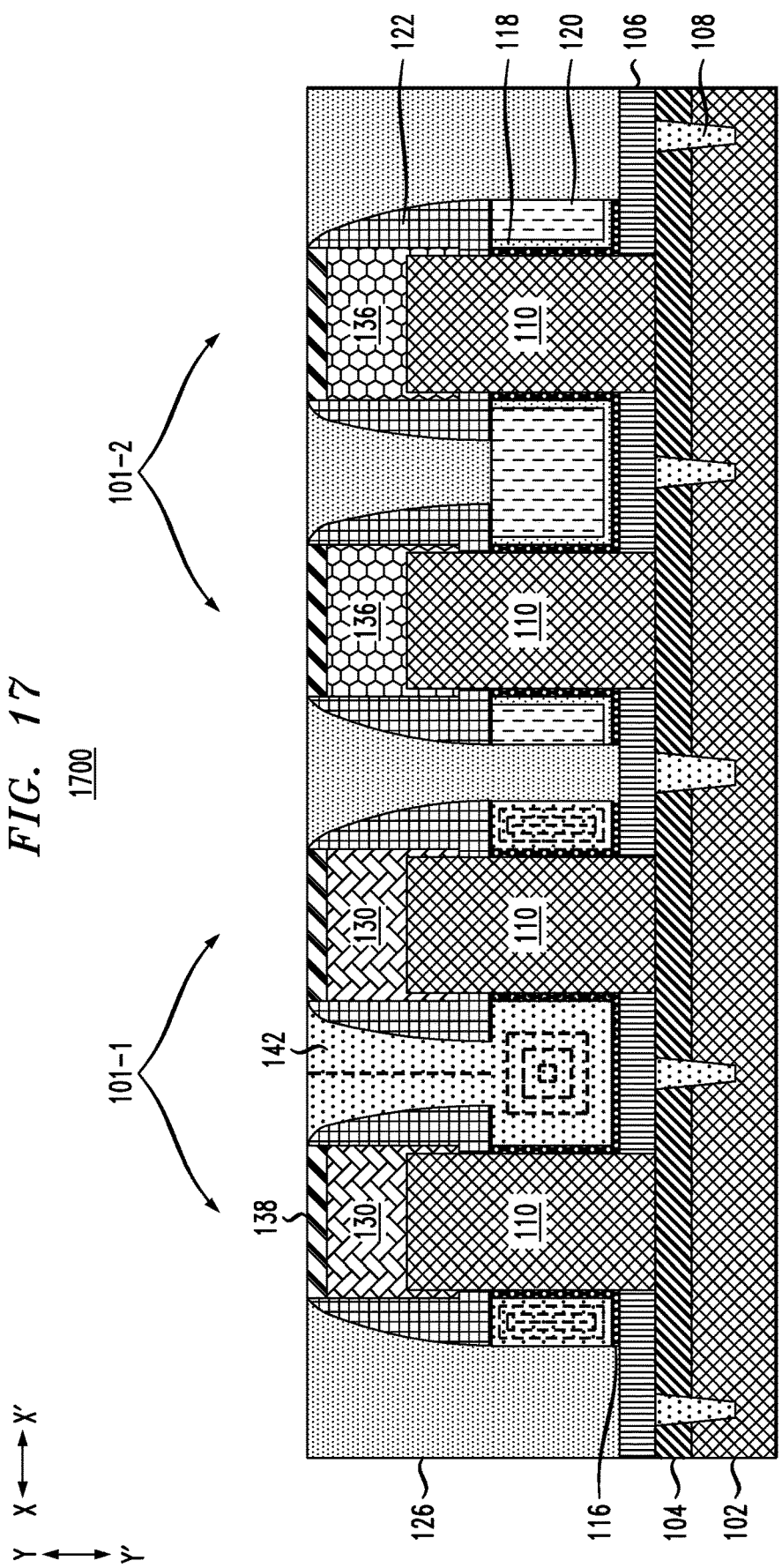
FIG. 17 depicts a cross-sectional view of the FIG. 16 structure following planarization of the nFET gate conductor, according to an embodiment of the invention.

FIG. 17 shows a cross-sectional view 1700 of the FIG. 16 structure following an optional step of planarizing the nFET WFM 142. The nFET WFM 142 may be planarized using CMP or other suitable processing such that the top surface of the nFET WFM 142 is substantially coplanar with the top surface of the nitride 138.

Figure 18:
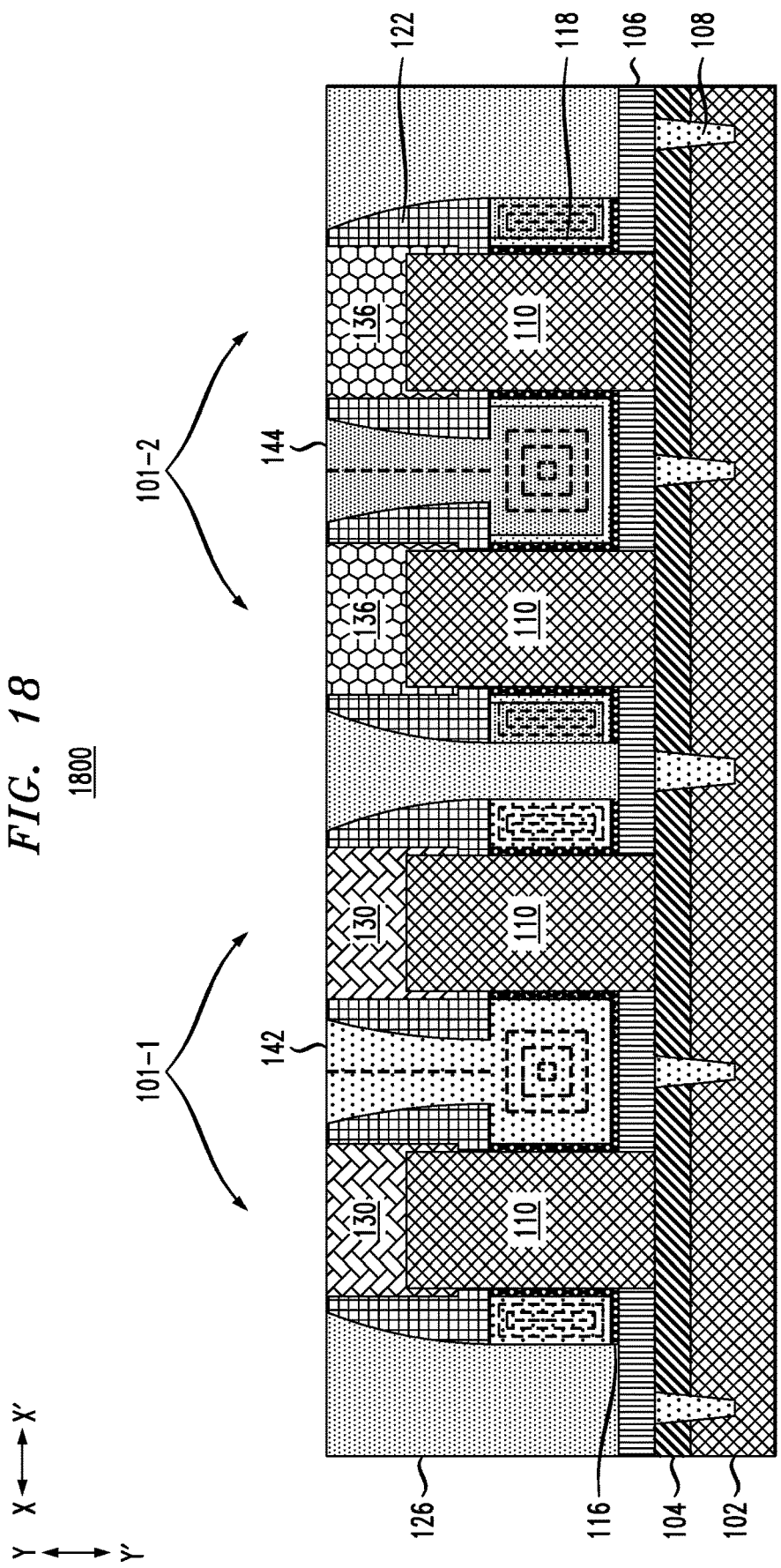
FIG. 18 depicts a cross-sectional view of the FIG. 17 structure following removal of the dummy gate in the pFET-pFET shared region, formation of the pFET gate conductor and planarization of the pFET gate conductor, according to an embodiment of the invention.

FIG. 18 shows a cross-sectional view 1800 of the FIG. 17 structure following formation of the gate conductor 144 for the pFET VTFETs in the p-p shared region using processing similar to that described above with respect to FIGS. 15 and 16. A mask may be formed to open the p-p shared region, followed by removal of portions of the oxide layer in the p-p shared region and removal of the dummy gate 120 in the p-p shared region. It should be noted that while the capping layer 118 is removed in the n-n shared region, the capping layer 118 is not removed in the p-p shared region. In another embodiment, the capping layer 118 is removed in the p-p shared region before the pFET gate conductor 144 is formed.

The pFET gate conductor 144 may be formed of a WFM, and thus may also be referred to herein as pFET WFM 144. The pFET WFM 144 may be formed of TiN, TaN, or another suitable material. In some embodiments, the pFET WFM 144 includes a metal stack, where a thicker barrier layer (e.g., of TiN, TaN, etc.) is formed followed by a WFM such as titanium (Ti), aluminum (Al), titanium aluminum (TiAl), titanium aluminum carbon (TiAlC), or any combination of Ti and Al alloys. The difference between the pFET WFM 144 and the nFET WFM 142 may be different thickness of the barrier layer, use of different WFM materials, different thickness of WFM materials, combinations thereof, etc. The pFET gate conductor 144, also referred to as pFET WFM 144, may be formed using a conformal deposition process such as ALD in a manner similar to that described above with respect to formation of the nFET WFM 142. As illustrated by the bold dashed lines in FIG. 18, formation of the pFET WFM 144 may include ALD deposition from both sides layer-by-layer, with subsequent layers pinching off the remaining space until the region is completely filled as illustrated. This layer-by-layer deposition of the pFET WFM 144 may result in some discontinuity or interface as indicated by the bold dash-dot lines in FIG. 18.

The cross-sectional view 1800 of FIG. 18 further illustrates gate planarization (e.g., using CMP or another suitable process) following formation of the pFET WFM 144. The gate planarization removes the nitride 138, and stops at the top surfaces of the nFET top source/drain regions 130 and pFET top source/drain regions 136. It should be appreciated, however, that in other embodiments the gate planarization may not remove the nitride 138 as in some cases the nitride 138 helps in integration during downstream processing described below. Thus, although not shown in subsequent figures, the nitride layer 138 may remain in some embodiments following the gate planarization.

Figure 19:
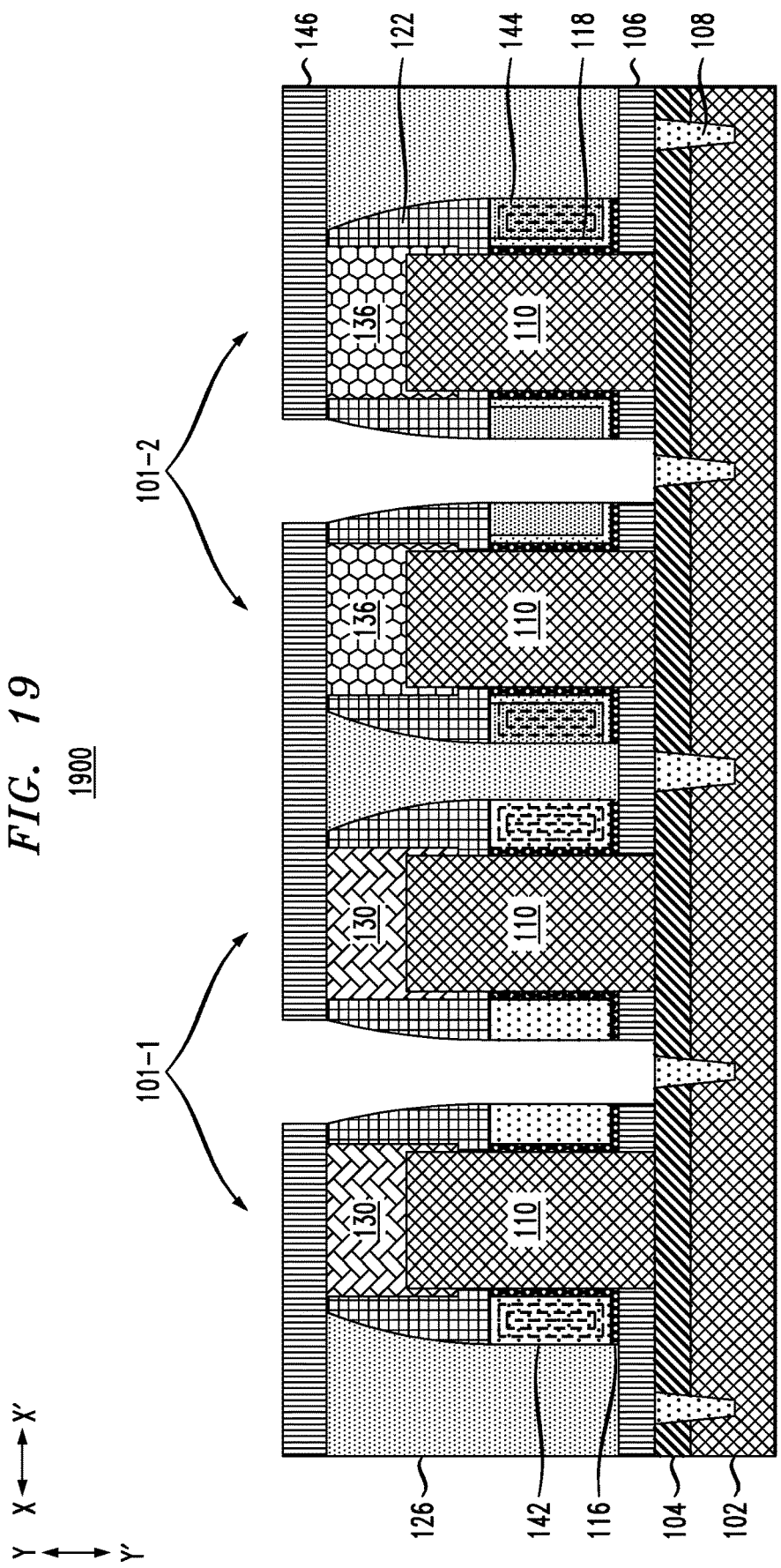
FIG. 19 depicts a cross-sectional view of the FIG. 18 structure following formation of a mask to open the nFET-nFET and pFET-pFET shared regions and following nFET-nFET and pFET-pFET isolation gate cut, according to an embodiment of the invention.

FIG. 19 shows a cross-sectional view 1900 of the FIG. 18 structure following formation of a mask 146 to open the n-n and p-p shared regions, and following n-n and p-p isolation gate cuts. The mask 146 may be formed with similar materials and sizing as that of the mask 128. The openings in the mask 146 are aligned to the n-n and p-p shared regions (e.g., between the fins 110 in the active regions 101-1 and 101-2). An isolation gate cut is then performed using RIE or other suitable processing to remove portions of the nFET WFM 142 and pFET WFM 144 exposed by the openings in the mask 146 not protected by the self-aligned spacers 122. As illustrated, dielectric layer 118 and bottom spacer 106 exposed by the mask 146 not protected by the self-aligned spacers 122 are also removed.

Figure 20:
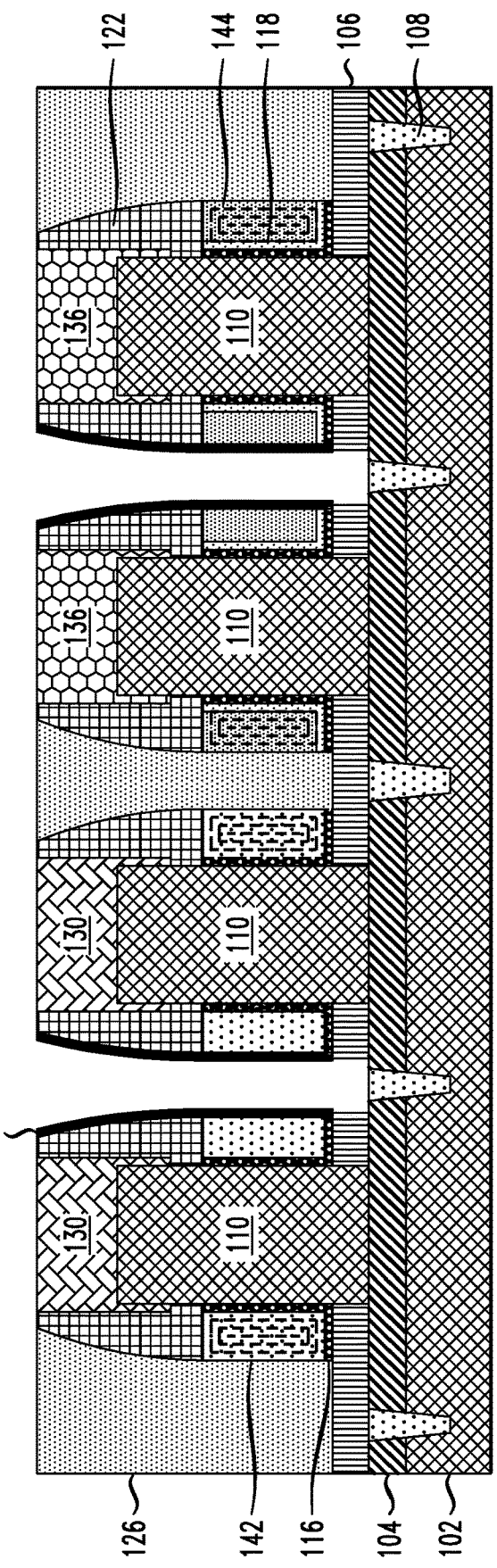
FIG. 20 depicts a cross-sectional view of the FIG. 19 structure following formation of a self-aligned inner spacer, according to an embodiment of the invention.

FIG. 20 shows a cross-sectional view 2000 of the FIG. 19 structure following formation of a self-aligned inner spacer 148. The self-aligned inner spacer 148 is formed over the exposed sidewalls of the nFET WFM 142, the pFET WFM 144 and the self-aligned spacers 122. The self-aligned inner spacer 148 may be formed of any suitable material that will isolate the surrounding materials (e.g., nFET WFM 142 and pFET WFM 144) from contact material formed during later processing described below. The self-aligned inner spacer 148 may have a uniform thickness in the range of 5 nm to 15 nm, although other thicknesses above or below this range may be used as desired for a particular application.

Figure 21:
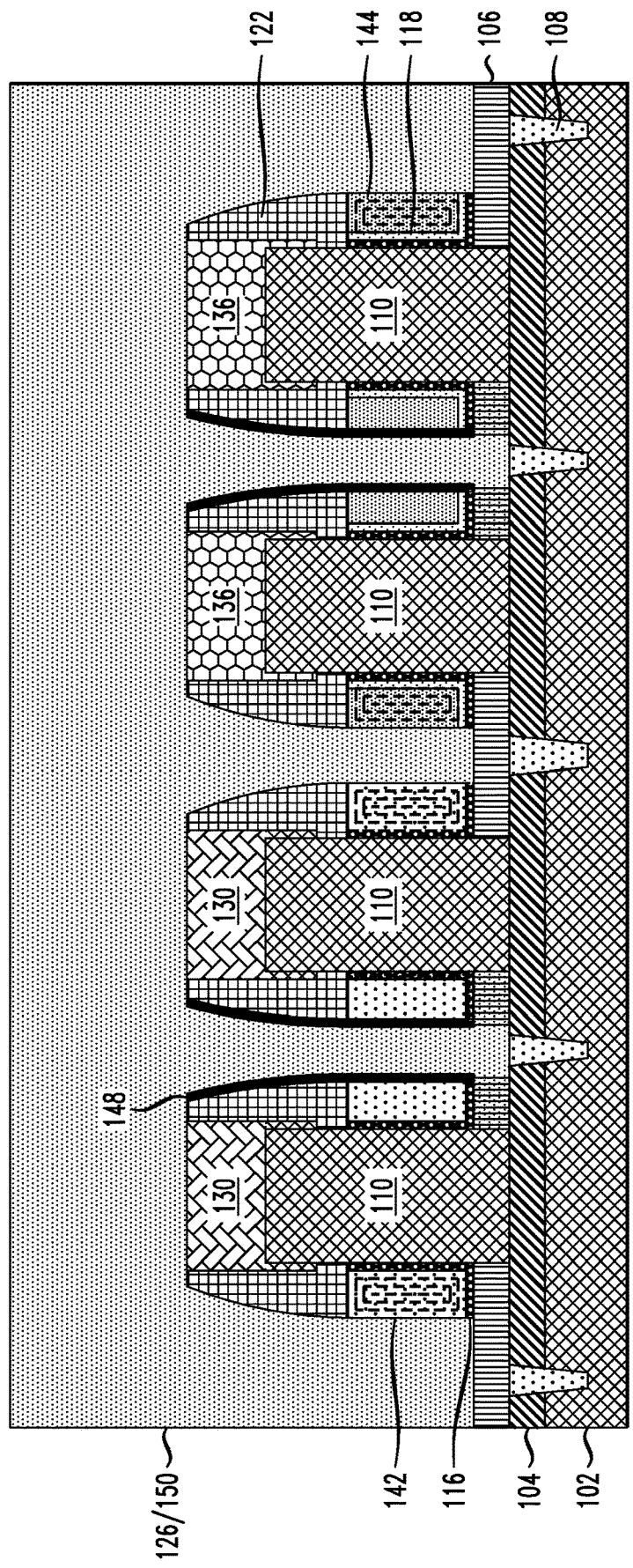
FIG. 21 depicts a cross-sectional view of the FIG. 20 structure following an oxide fill, according to an embodiment of the invention.

FIG. 21 shows a cross-sectional view 2100 of the FIG. 20 structure following fill with an oxide 150. The oxide 150 may be formed of the same material as oxide 126, and thus is denoted in FIG. 21 and subsequent figures as 126/150.

Figure 22:
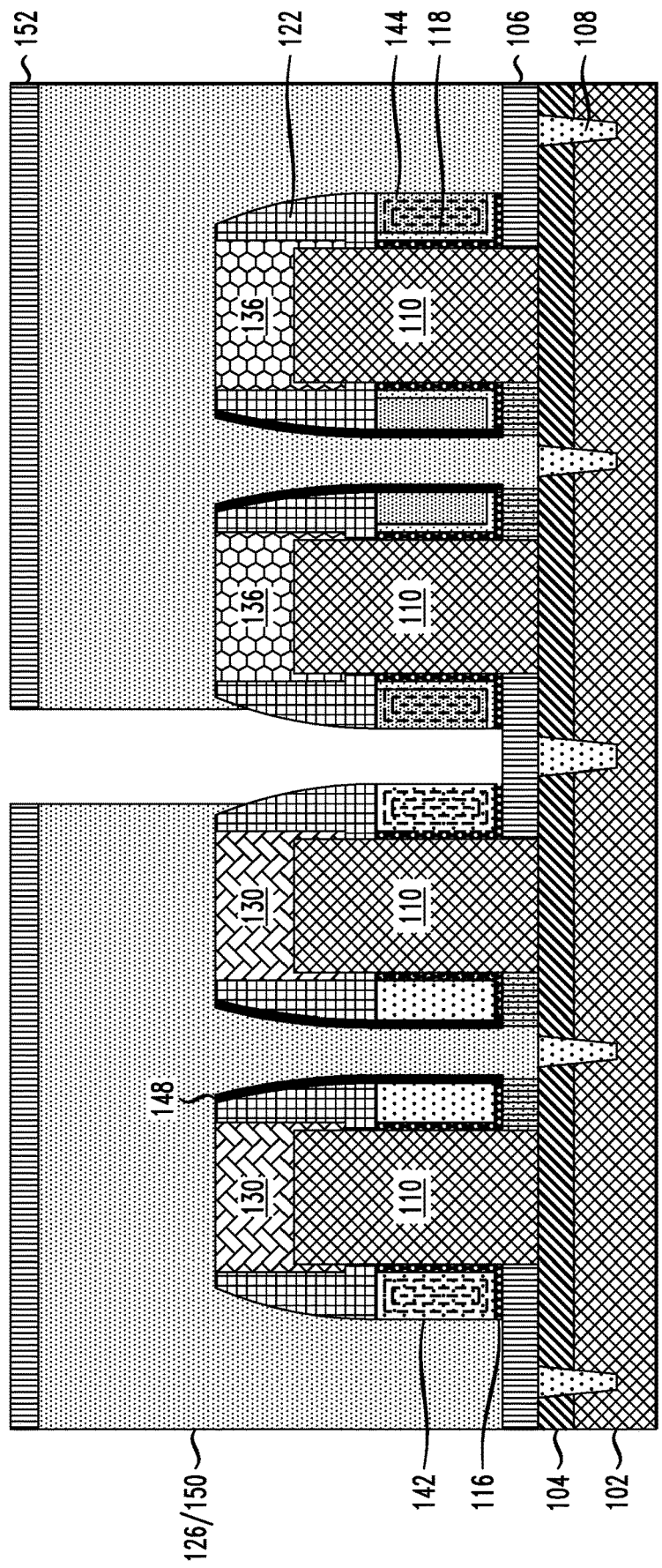
FIG. 22 depicts a cross-sectional view of the FIG. 21 structure following formation of a mask to open the nFET-pFET shared gate region, according to an embodiment of the invention.

FIG. 22 shows a cross-sectional view 2200 of the FIG. 21 structure following patterning of a mask 152 to open the n-p shared gate region. The mask 152 may be formed of similar materials and with similar processing as that of mask 128.

Figure 23:
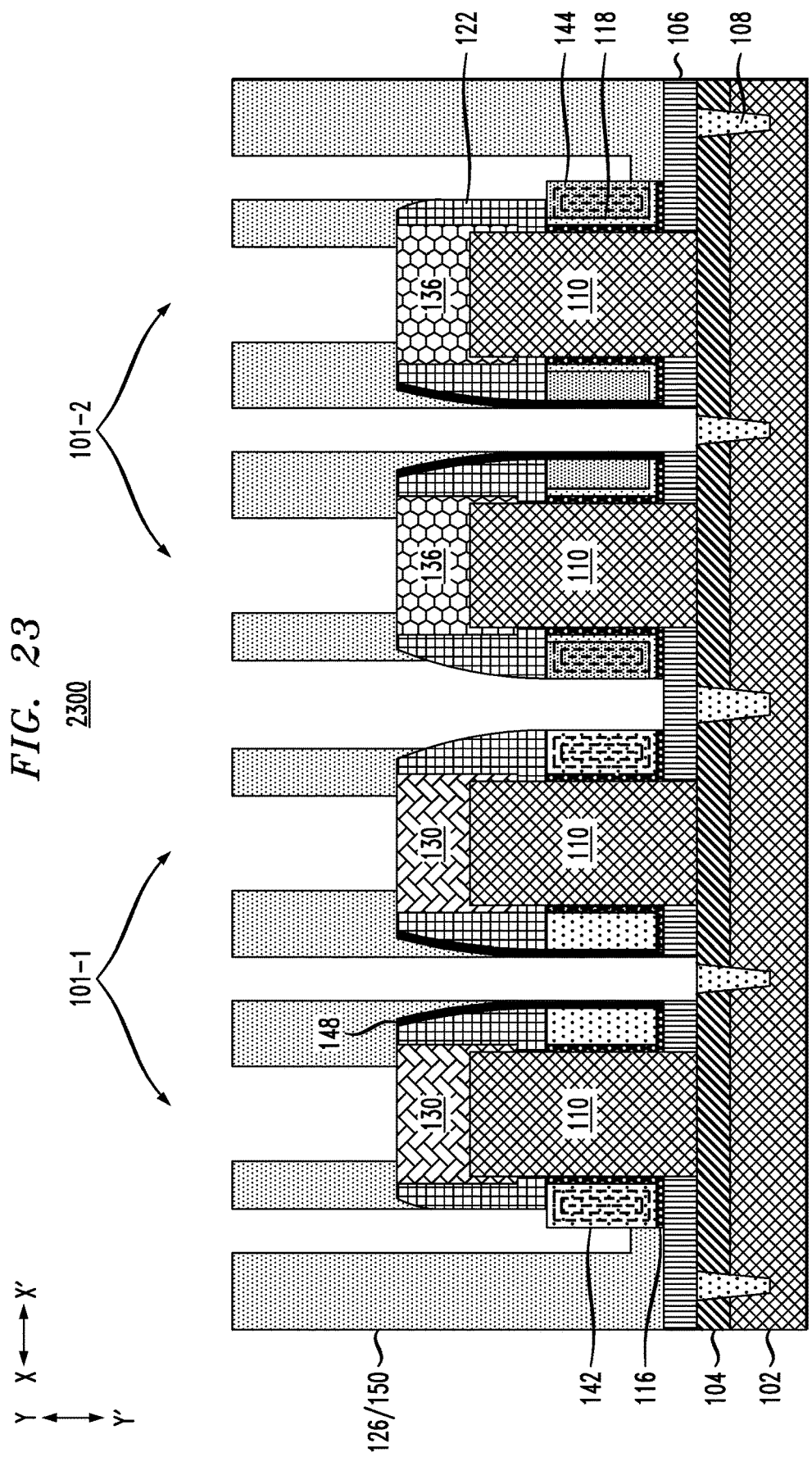
FIG. 23 depicts a cross-sectional view of the FIG. 22 structure following formation of contact openings, according to an embodiment of the invention.

FIG. 23 shows a cross-sectional view 2300 of the FIG. 22 structure following formation of openings for contacts to the top source/drain regions 130 and 136, and to the bottom source/drain region 104 in the n-n and p-p shared regions. These openings may be formed by patterning a mask using processing similar to that described with respect to mask 152.

Figure 24:
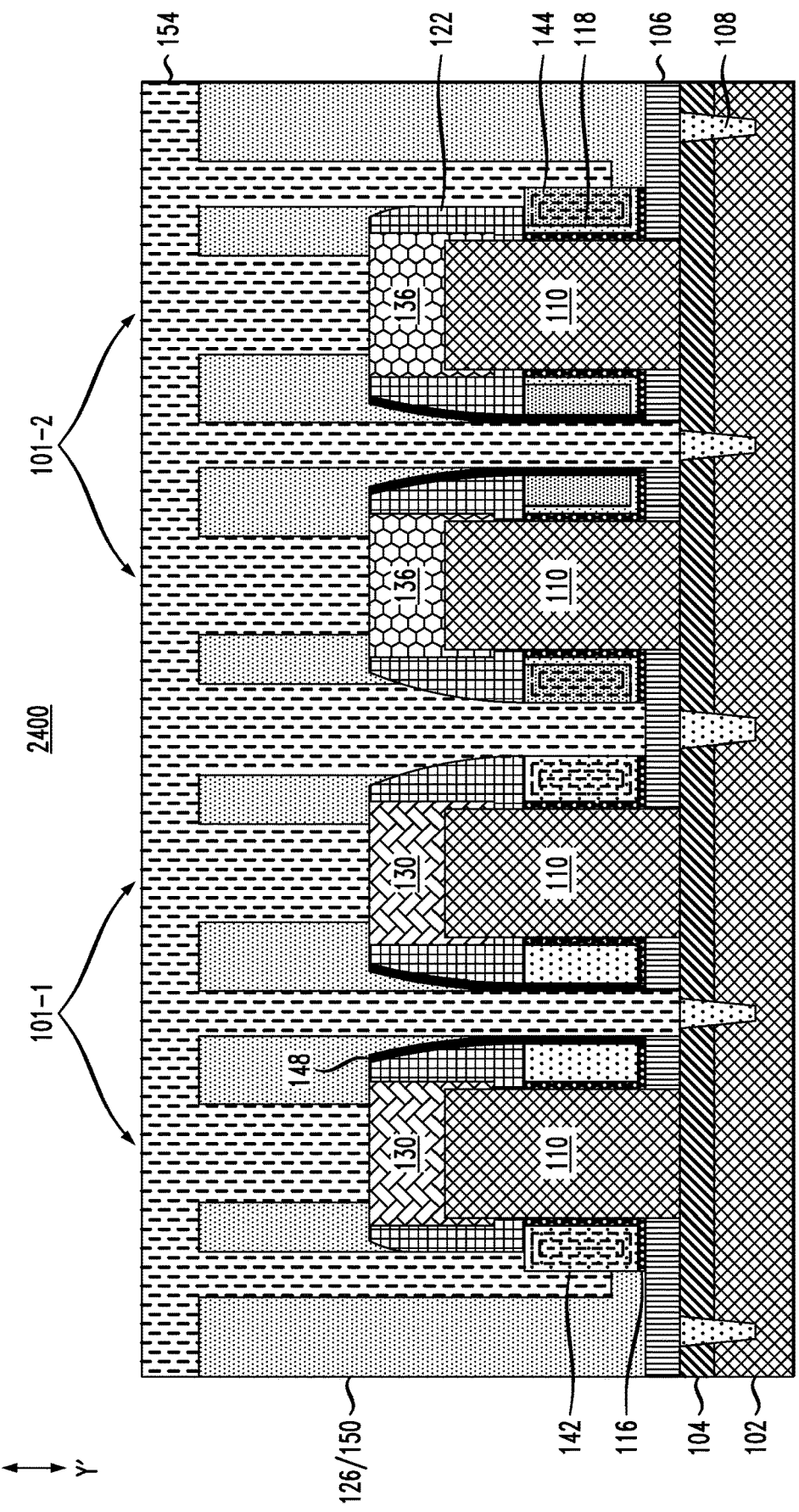
FIG. 24 depicts a cross-sectional view of the FIG. 23 structure following formation of contact material, according to an embodiment of the invention.

FIG. 24 shows a cross-sectional view 2400 of the FIG. 23 structure following formation of contact material 154. The contact material 154 may be formed using any suitable deposition process such as PVD, chemical vapor deposition (CVD), ALD, etc. The contact material 154 may comprise titanium/titanium nitride (Ti/TiN) plus tungsten (W) or another suitable material such as Ti/TiN plus cobalt (Co), etc. As shown in FIG. 24, the contact material 154 is formed to overfill the structure.

Figure 25:
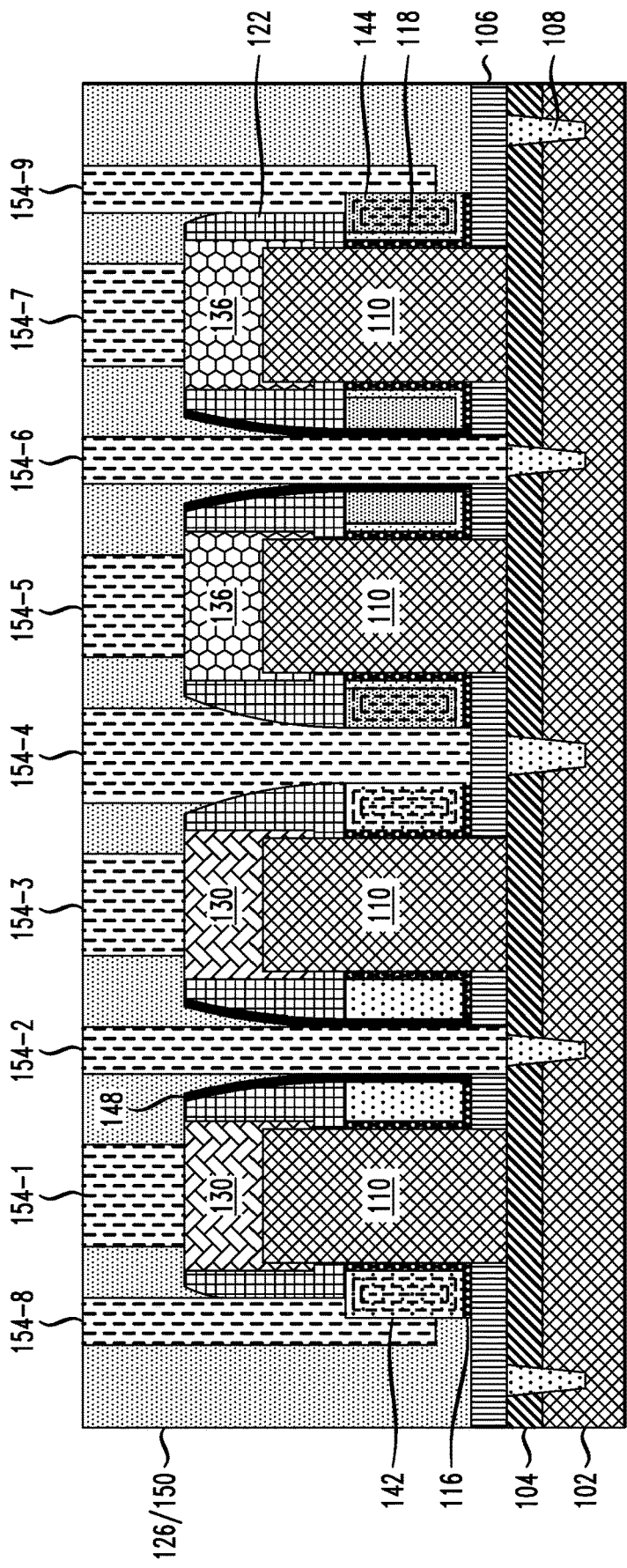
FIG. 25 depicts a cross-sectional view of the FIG. 24 structure following planarization to form contacts, according to an embodiment of the invention.

FIG. 25 shows a cross-sectional view 2500 of the FIG. 24 structure following planarization using CMP or another suitable process to separate the contact material 154 into separate contacts 154-1 through 154-9.

The contacts 154-1 and 154-3 connect to the nFET top source/drain regions 130, and the contacts 154-5 and 154-7 contact the pFET top source/drain regions 136.

The contacts 154-2 and 154-6 provide bottom source/drain self-aligned contacts between the n-n and p-p regions, respectively. The contacts 154-2 and 154-6 further abut the etched RMG gate edges in the n-n and p-p regions. The contacts 154-2 and 154-6 connect to the bottom source/drain region 106 in the n-n and p-p shared regions, respectively.

The contact 154-4 provides an nFET gate to pFET gate self-aligned strap to electrically connect adjacent opposite type gates. The contact 154-4 connects to the nFET WFM 142 and pFET WFM 144 in the n-p shared gate region.

The contacts 154-8 and 154-9 provide gate contacts for the nFET and pFET devices at the edges of the row as illustrated.

In some embodiments, a semiconductor structure comprises a substrate, a bottom source/drain region disposed on a top surface of the substrate, and a plurality of fins disposed over a top surface of the bottom source/drain region. The fins provide vertical transport channels for one or more VTFETs. The semiconductor structure also comprises at least one self-aligned shared contact disposed between an adjacent pair of the plurality of fins. The adjacent pair of the plurality of fins comprises a first fin providing a first vertical transport channel for a first VTFET and a second fin providing a second vertical transport channel for a second VTFET.

The first VTFET and the second VTFET may comprise one of n-type and p-type VTFETs, and the at least one self-aligned shared contact may comprise a contact to a portion of the bottom source/drain region shared by the first VTFET and the second VTFET.

The first VTFET may comprise an n-type VTFET and the second VTFET may comprise a p-type VTFET, and the at least one self-aligned shared contact may comprise a gate contact to a first gate conductor surrounding the first fin of the first VTFET and a second gate conductor surrounding the second fin of the second VTFET. The first gate conductor may comprise a first replacement metal gate WFM material, and the second gate conductor comprises a second replacement metal gate WFM material different than the first replacement metal gate WFM material.

The semiconductor structure may further comprise a bottom spacer disposed over the bottom source/drain region surrounding a portion of sidewalls of the plurality of fins, a gate dielectric disposed over the bottom spacer and surrounding a portion of the sidewalls of the plurality of fins, top source/drain regions disposed over top surfaces of the plurality of fins, a first gate conductor disposed over the gate dielectric surrounding ones of the plurality of fins providing vertical transport channels for n-type VTFETs, a second gate conductor disposed over the gate dielectric surrounding ones of the plurality of fins providing vertical transport channels for p-type VTFETs, and self-aligned spacers disposed over the gate dielectric, the first gate conductor and the second gate conductor surrounding a portion of the sidewalls of the plurality of fins and sidewalls of the top source/drain regions.

The plurality of fins may comprise at least a first pair of adjacent fins providing respective vertical transport channels for a first pair of VTFETs, the first pair of VTFETs comprising one of n-type VTFETs and p-type VTFETs. The semiconductor structure may further comprise inner spacers disposed on sidewalls of the gate dielectric, one of the first gate conductor and the second gate conductor, and the self-aligned spacers between the first pair of adjacent fins, and a first contact to the bottom source/drain region disposed between the inner spacers disposed between the first pair of adjacent fins, the first contact being shared by the first pair of VTFETs.

The plurality of fins may further comprise at least a second pair of adjacent fins providing respective vertical transport channels for a second pair of VTFETs, the second pair of VTFETs comprising the other one of n-type VTFETs and p-type VTFETs. The semiconductor structure may further comprise inner spacers disposed on sidewalls of the gate dielectric, the other one of the first gate conductor and the second gate conductor, and the self-aligned spacers disposed between the second pair of adjacent fins, and a second contact to the bottom source/drain region disposed between the inner spacers disposed between the second pair of adjacent fins, the second contact being shared by the second pair of VTFETs.

The first contact to the bottom source/drain region may be self-aligned to etched edges of said one of the first gate conductor and the second gate conductor disposed between the first pair of adjacent fins, and the second contact to the bottom source/drain region may be self-aligned to etched edges of said other one of the first gate conductor and the second gate conductor disposed between the second pair of adjacent fins.

The plurality of fins may further comprise at least a third pair of adjacent fins, the third pair of adjacent fins comprising one of the fins from the first pair of adjacent fins and one of the fins from the second pair of adjacent fins, and the semiconductor structure may further comprise a self-aligned shared gate contact disposed over the bottom spacer between the first gate conductor and the second gate conductor. The self-aligned shared gate contact provides a strapping that electrically connects the first gate conductor and the second gate conductor.

In some embodiments, integrated circuits comprise one or more VTFETs or other semiconductor structures described above.

In some embodiments, a method of forming a semiconductor structure comprises forming a bottom source/drain region over a top surface of a substrate, forming a plurality of fins over a top surface of the bottom source/drain region, the fins providing vertical transport channels for one or more VTFETs, and forming at least one self-aligned shared contact between an adjacent pair of the plurality of fins, the adjacent pair of the plurality of fins comprising a first fin providing a first vertical transport channel for a first VTFET and a second fin providing a second vertical transport channel for a second VTFET.

The first VTFET and the second VTFET may comprise one of n-type and p-type VTFETs, and the at least one self-aligned shared contact may comprise a contact to a portion of the bottom source/drain region shared by the first VTFET and the second VTFET.

The first VTFET may comprise an n-type VTFET and the second VTFET may comprise a p-type VTFET, and the at least one self-aligned shared contact comprises a gate contact to a first gate conductor surrounding the first fin of the first VTFET and a second gate conductor surrounding the second fin of the second VTFET.

The method may further comprise forming a bottom spacer over the bottom source/drain region surrounding a portion of sidewalls of the plurality of fins, forming an interlayer on exposed sidewalls of the plurality of fins, forming an oxide over top surfaces of the plurality of fins, forming a hard mask over top surfaces of the oxide, forming a gate dielectric over the top surface of the bottom spacer, the interlayer, sidewalls of the oxide and the hard mask, and forming a capping layer over the gate dielectric.

The method may further comprise depositing a dummy gate over the capping layer, planarizing the dummy gate such that a top surface of the dummy gate is substantially coplanar with the capping layer over the top surface of the hard mask, recessing the dummy gate below a bottom surface of the oxide, recessing the capping layer and the gate dielectric to be substantially coplanar with the recessed dummy gate, and forming self-aligned spacers over the recessed dummy gate and surrounding exposed sidewalls of the plurality of fins, the oxide and the hard mask.

The method may further comprise forming first masks over the recessed dummy gate between n-n shared regions for adjacent pairs of the plurality of fins providing vertical transport channels for n-type VTFETs and between p-p shared regions for adjacent pairs of the plurality of fins providing vertical transport channels for p-type VTFETs, and removing the recessed dummy gate exposed by the self-aligned spacers at ends of the plurality of fins, in the n-n shared regions, and in the p-p shared regions.

The method may further comprise filling an oxide, planarizing the oxide to be substantially coplanar with a top surface of the hard mask, patterning a second mask over the oxide to expose top surfaces of adjacent pairs of the plurality of fins in one of the n-n and p-p shared regions, removing portions of the hard mask exposed by the second mask to reveal top surfaces of the adjacent pairs of the plurality of fins in one of the n-n and p-p shared regions, forming top source/drain regions over the revealed top surfaces of the adjacent pairs of the plurality of fins in said one of the n-n and p-p shared regions, removing the second mask, forming an encapsulation layer, patterning a third mask over the encapsulation layer to expose top surfaces of adjacent pairs of the plurality of fins in said other one of the n-n and p-p shared regions, removing portions of the hard mask exposed by the third mask to reveal top surfaces of the adjacent pairs of the plurality of fins in said other one of the n-n and p-p shared regions, forming top source/drain regions over the revealed top surfaces of the adjacent pairs of the plurality of fins in said other one of the n-n and p-p shared regions, and removing the third mask and the encapsulation layer.

The method may further comprise recessing the top/source drain regions, forming nitride layers over top surfaces of the recessed top source/drain regions, patterning a fourth mask to expose the self-aligned spacers and recessed dummy gate formed between adjacent pairs of the plurality of fins in said one of the n-n and p-p shared regions, removing the oxide over the recessed dummy gate surrounding the adjacent pairs of the plurality of fins in said one of the n-n and p-p shared regions, removing the recessed dummy gate surrounding the adjacent pairs of the plurality of fins in said one of the n-n and p-p shared regions, removing the fourth mask, forming a first gate conductor surrounding the adjacent pairs of the plurality of fins in said one of the n-n and p-p shared regions, patterning a fifth mask to expose the self-aligned spacers and recessed dummy gate formed between adjacent pairs of the plurality of fins in said other one of the n-n and p-p shared regions, removing the oxide over the recessed dummy gate surrounding the adjacent pairs of the plurality of fins in said other one of the n-n and p-p shared regions, removing the recessed dummy gate surrounding the adjacent pairs of the plurality of fins in said other one of the n-n and p-p shared regions, removing the fifth mask, and forming a second gate conductor surrounding the adjacent pairs of the plurality of fins in said other one of the n-n and p-p shared regions.

The method may further comprise planarizing the first and second gate conductors to expose top surfaces of the top source/drain regions, patterning a sixth mask to expose the first gate conductor and the second gate conductor in the n-n and p-p shared regions, removing portions of the first gate conductor, the second gate conductor and the bottom spacer exposed by the patterned sixth mask to isolate gate regions for each of the plurality of fins, and forming inner spacers on sidewalls of the first gate conductor, the second gate conductor, and the self-aligned spacers.

The method may further comprise filling an oxide, patterning a seventh mask to expose the first gate conductor and the second gate conductor between adjacent pairs of the plurality of fins in the n-p shared regions, removing portions of the first gate conductor and the second gate conductor exposed by the patterned seventh mask, removing the seventh mask, patterning an eighth mask to expose top surfaces of the top source/drain regions and regions between the self-aligned spacers between adjacent pairs of the plurality of fins, and removing portions of the oxide exposed by the patterned eighth mask to expose: top surfaces of the top source/drain regions; portions of the bottom spacer between adjacent pairs of the plurality of fins in the n-p share regions; and portions of the bottom source/drain region between adjacent pairs of the plurality of fins in the n-n and p-p shared regions.

The method may further comprise forming top source/drain contacts, forming shared bottom source/drain contacts to the bottom source/drain region between adjacent pairs of the plurality of fins in the n-n and p-p shared regions, and forming shared gate contacts to the first gate conductor and the second gate conductor between adjacent pairs of the plurality of fins in the n-p shared regions.

It is to be appreciated that the various materials, processing methods (e.g., etch types, deposition types, etc.) and dimensions provided in the discussion above are presented by way of example only. Various other suitable materials, processing methods, and dimensions may be used as desired.

Semiconductor devices and methods for forming same in accordance with the above-described techniques can be employed in various applications, hardware, and/or electronic systems. Suitable hardware and systems for implementing embodiments of the invention may include, but are not limited to, sensors an sensing devices, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure, comprising:
a substrate;
a bottom source/drain region disposed on a top surface of the substrate;
a plurality of fins disposed over a top surface of the bottom source/drain region, the fins providing vertical transport channels for one or more vertical transport field-effect transistors; and
at least one self-aligned shared contact disposed between a given adjacent pair of the plurality of fins, the given adjacent pair of the plurality of fins comprising a first fin providing a first vertical transport channel for a first vertical transport field-effect transistor and a second fin providing a second vertical transport channel for a second vertical transport field-effect transistor;
wherein the first vertical transport field-effect transistor comprises an n-type vertical transport field-effect transistor and the second vertical transport field-effect transistor comprises a p-type vertical transport field-effect transistor, and wherein the at least one self-aligned shared contact comprises a gate contact to a first gate conductor surrounding the first fin of the first vertical transport field-effect transistor and a second gate conductor surrounding the second fin of the second vertical transport field-effect transistor.

2. The semiconductor structure of claim 1, further comprising at least one additional self-aligned shared contact disposed between an additional adjacent pair of the plurality of fins, the additional adjacent pair of the plurality of fins comprising a third fin providing a third vertical transport channel for a third vertical transport field-effect transistor and a fourth fin providing a second vertical transport channel for a fourth vertical transport-field effect transistor, wherein the third vertical transport field-effect transistor and the fourth vertical transport field-effect transistor comprise one of n-type and p-type vertical transport field-effect transistors, and wherein the at least one additional self-aligned shared contact comprises a contact to a portion of the bottom source/drain region shared by the third vertical transport field-effect transistor and the fourth vertical transport field-effect transistor.

3. The semiconductor structure of claim 2, wherein the third vertical transport field-effect transistor is the same as one of the first vertical transport field-effect transistor and the second vertical transport field-effect transistor.

4. The semiconductor structure of claim 1, wherein the first gate conductor comprises a first replacement metal gate work function metal material, and wherein the second gate conductor comprises a second replacement metal gate work function metal material different than the first replacement metal gate work function metal material.

5. The semiconductor structure of claim 1, further comprising:
   a bottom spacer disposed over the bottom source/drain region surrounding a portion of sidewalls of the plurality of fins;
   a gate dielectric disposed over the bottom spacer and surrounding a portion of the sidewalls of the plurality of fins;
   top source/drain regions disposed over top surfaces of the plurality of fins;
   the first gate conductor disposed over the gate dielectric surrounding ones of the plurality of fins providing vertical transport channels for n-type vertical transport field-effect transistors;
   the second gate conductor disposed over the gate dielectric surrounding ones of the plurality of fins providing vertical transport channels for p-type vertical transport field-effect transistors; and
   self-aligned spacers disposed over the gate dielectric, the first gate conductor and the second gate conductor surrounding a portion of the sidewalls of the plurality of fins and sidewalls of the top source/drain regions.

6. A semiconductor structure, comprising:
   a substrate;
   a bottom source/drain region disposed on a top surface of the substrate;
   a plurality of fins disposed over a top surface of the bottom source/drain region, the fins providing vertical transport channels for one or more vertical transport field-effect transistors;
   at least one self-aligned shared contact disposed between an adjacent pair of the plurality of fins, the adjacent pair of the plurality of fins comprising a first fin providing a first vertical transport channel for a first vertical transport field-effect transistor and a second fin providing a second vertical transport channel for a second vertical transport field-effect transistor;
   a bottom spacer disposed over the bottom source/drain region surrounding a portion of sidewalls of the plurality of fins;
   a gate dielectric disposed over the bottom spacer and surrounding a portion of the sidewalls of the plurality of fins;
   top source/drain regions disposed over top surfaces of the plurality of fins;
   a first gate conductor disposed over the gate dielectric surrounding ones of the plurality of fins providing vertical transport channels for n-type vertical transport field-effect transistors;
   a second gate conductor disposed over the gate dielectric surrounding ones of the plurality of fins providing vertical transport channels for p-type vertical transport field-effect transistors; and
   self-aligned spacers disposed over the gate dielectric, the first gate conductor and the second gate conductor surrounding a portion of the sidewalls of the plurality of fins and sidewalls of the top source/drain regions;
   wherein the plurality of fins comprise at least a first pair of adjacent fins providing respective vertical transport channels for a first pair of vertical transport field-effect transistors, the first pair of vertical transport field-effect transistors comprising one of n-type vertical transport field-effect transistors and p-type vertical transport field-effect transistors, and further comprising:
   inner spacers disposed on sidewalls of the gate dielectric, one of the first gate conductor and the second gate conductor, and the self-aligned spacers between the first pair of adjacent fins; and
   a first contact to the bottom source/drain region disposed between the inner spacers disposed between the first pair of adjacent fins, the first contact being shared by the first pair of vertical transport field-effect transistors.

7. The semiconductor structure of claim 6, wherein the plurality of fins further comprise at least a second pair of adjacent fins providing respective vertical transport channels for a second pair of vertical transport field-effect transistors, the second pair of vertical transport field-effect transistors comprising the other one of n-type vertical transport field-effect transistors and p-type vertical transport field-effect transistors, and further comprising:
   inner spacers disposed on sidewalls of the gate dielectric, the other one of the first gate conductor and the second gate conductor, and the self-aligned spacers disposed between the second pair of adjacent fins; and
   a second contact to the bottom source/drain region disposed between the inner spacers disposed between the second pair of adjacent fins, the second contact being shared by the second pair of vertical transport field-effect transistors.

8. The semiconductor structure of claim 7, wherein the first contact to the bottom source/drain region is self-aligned to etched edges of said one of the first gate conductor and the second gate conductor disposed between the first pair of adjacent fins, and wherein the second contact to the bottom source/drain region is self-aligned to etched edges of said other one of the first gate conductor and the second gate conductor disposed between the second pair of adjacent fins.

9. The semiconductor structure of claim 7, wherein the plurality of fins further comprises at least a third pair of adjacent fins, the third pair of adjacent fins comprising one of the fins from the first pair of adjacent fins and one of the fins from the second pair of adjacent fins, and further comprising a self-aligned shared gate contact disposed over the bottom spacer between the first gate conductor and the second gate conductor.

10. The semiconductor structure of claim 9, wherein the self-aligned shared gate contact provides a strapping that electrically connects the first gate conductor and the second gate conductor.

11. An integrated circuit comprising:
   one or more vertical transport field-effect transistors comprising:

a substrate;
a bottom source/drain region disposed on a top surface of the substrate;
a plurality of fins disposed over a top surface of the bottom source/drain region, the fins providing vertical transport channels for the one or more vertical transport field-effect transistors; and
at least one self-aligned shared contact disposed between a given adjacent pair of the plurality of fins, the given adjacent pair of the plurality of fins comprising a first fin providing a first vertical transport channel for a first vertical transport field-effect transistor and a second fin providing a second vertical transport channel for a second vertical transport field-effect transistor;
wherein the first vertical transport field-effect transistor comprises an n-type vertical transport field-effect transistor and the second vertical transport field-effect transistor comprises a p-type vertical transport field-effect transistor, and wherein the at least one self-aligned shared contact comprises a gate contact to a first gate conductor surrounding the first fin of the first vertical transport field-effect transistor and a second gate conductor surrounding the second fin of the second vertical transport field-effect transistor.

12. The integrated circuit of claim 11, further comprising at least one additional self-aligned shared contact disposed between an additional adjacent pair of the plurality of fins, the additional adjacent pair of the plurality of fins comprising a third fin providing a third vertical transport channel for a third vertical transport field-effect transistor and a fourth fin providing a second vertical transport channel for a fourth vertical transport-field effect transistor, wherein the third vertical transport field-effect transistor and the fourth vertical transport field-effect transistor comprise one of n-type and p-type vertical transport field-effect transistors, and wherein the at least one additional self-aligned shared contact comprises a contact to a portion of the bottom source/drain region shared by the third vertical transport field-effect transistor and the fourth vertical transport field-effect transistor.

13. The integrated circuit of claim 12, wherein the third vertical transport field-effect transistor is the same as one of the first vertical transport field-effect transistor and the second vertical transport field-effect transistor.

14. The integrated circuit of claim 11, wherein the first gate conductor comprises a first replacement metal gate work function metal material, and wherein the second gate conductor comprises a second replacement metal gate work function metal material different than the first replacement metal gate work function metal material.

15. The integrated circuit of claim 11, further comprising:
a bottom spacer disposed over the bottom source/drain region surrounding a portion of sidewalls of the plurality of fins;
a gate dielectric disposed over the bottom spacer and surrounding a portion of the sidewalls of the plurality of fins;
top source/drain regions disposed over top surfaces of the plurality of fins;
the first gate conductor disposed over the gate dielectric surrounding ones of the plurality of fins providing vertical transport channels for n-type vertical transport field-effect transistors;
the second gate conductor disposed over the gate dielectric surrounding ones of the plurality of fins providing vertical transport channels for p-type vertical transport field-effect transistors; and
self-aligned spacers disposed over the gate dielectric, the first gate conductor and the second gate conductor surrounding a portion of the sidewalls of the plurality of fins and sidewalls of the top source/drain regions.

16. The integrated circuit of claim 15, wherein the plurality of fins comprise at least a first pair of adjacent fins providing respective vertical transport channels for a first pair of vertical transport field-effect transistors, the first pair of vertical transport field-effect transistors comprising one of n-type vertical transport field-effect transistors and p-type vertical transport field-effect transistors, and further comprising:
inner spacers disposed on sidewalls of the gate dielectric, one of the first gate conductor and the second gate conductor, and the self-aligned spacers between the first pair of adjacent fins; and
a first contact to the bottom source/drain region disposed between the inner spacers disposed between the first pair of adjacent fins, the first contact being shared by the first pair of vertical transport field-effect transistors.

17. The integrated circuit of claim 16, wherein the plurality of fins further comprise at least a second pair of adjacent fins providing respective vertical transport channels for a second pair of vertical transport field-effect transistors, the second pair of vertical transport field-effect transistors comprising the other one of n-type vertical transport field-effect transistors and p-type vertical transport field-effect transistors, and further comprising:
inner spacers disposed on sidewalls of the gate dielectric, the other one of the first gate conductor and the second gate conductor, and the self-aligned spacers disposed between the second pair of adjacent fins; and
a second contact to the bottom source/drain region disposed between the inner spacers disposed between the second pair of adjacent fins, the second contact being shared by the second pair of vertical transport field-effect transistors.

18. The integrated circuit of claim 17, wherein the first contact to the bottom source/drain region is self-aligned to etched edges of said one of the first gate conductor and the second gate conductor disposed between the first pair of adjacent fins, and wherein the second contact to the bottom source/drain region is self-aligned to etched edges of said other one of the first gate conductor and the second gate conductor disposed between the second pair of adjacent fins.

19. The integrated circuit of claim 17, wherein the given adjacent pair of the plurality of fins comprises one of the fins from the first pair of adjacent fins and one of the fins from the second pair of adjacent fins.

20. The integrated circuit of claim 19, wherein the self-aligned shared gate contact provides a strapping that electrically connects the first gate conductor and the second gate conductor.